(12) United States Patent
Berman et al.

(10) Patent No.: US 11,581,906 B1
(45) Date of Patent: Feb. 14, 2023

(54) HIERARCHICAL ERROR CORRECTION CODE DECODING USING MULTISTAGE CONCATENATED CODES

(71) Applicant: SAMSUNG ELECTRONICS CO., LTD., Suwon-si (KR)

(72) Inventors: Amit Berman, Binyamina (IL); Eli Haim, Raanana (IL); Ariel Doubchak, Hertsliya (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/646,156

(22) Filed: Dec. 28, 2021

(51) Int. Cl.
*H03M 13/00* (2006.01)
*H03M 13/29* (2006.01)
*H03M 13/45* (2006.01)
*H03M 13/15* (2006.01)
*G06F 11/10* (2006.01)

(52) U.S. Cl.
CPC ..... *H03M 13/2906* (2013.01); *G06F 11/1076* (2013.01); *H03M 13/1515* (2013.01); *H03M 13/45* (2013.01)

(58) Field of Classification Search
None
See application file for complete search history.

(56) References Cited

U.S. PATENT DOCUMENTS

| | | | | |
|---|---|---|---|---|
| 8,510,624 B2* | 8/2013 | Kim | ........... | H03M 13/2927 370/242 |
| 8,671,326 B1* | 3/2014 | Tang | ........... | H03M 13/6343 714/800 |
| 10,367,527 B2* | 7/2019 | Chang | ........... | H03M 13/6561 |
| 2013/0091400 A1* | 4/2013 | Xia | ........... | G11B 20/1833 714/755 |
| 2015/0256204 A1* | 9/2015 | Torii | ........... | H03M 13/2909 714/755 |

(Continued)

OTHER PUBLICATIONS

C. Yang, Y. Emre and C. Chakrabarti, "Product Code Schemes for Error Correction in MLC NAND Flash Memories," in IEEE Transactions on Very Large Scale Integration (VLSI) Systems, vol. 20, No. 12, pp. 2302-2314, Dec. 2012, doi: 10.1109/TVLSI.2011.2174389. (Year: 2012).*

*Primary Examiner* — Daniel F. McMahon
(74) *Attorney, Agent, or Firm* — F. Chau & Associates, LLC

(57) ABSTRACT

Hierarchical coding architectures and schemes based on multistage concatenated codes are described. For instance, multiple encoder and decoder hierarchies may be implemented along with use of corresponding stages of concatenated codes. The coding scheme generally includes an inner coding scheme (e.g., a polar coding scheme, such as a hybrid polar code or Bose Chaudhuri and Hocquenghem (BCH) code), an outer coding scheme (e.g., a Reed-Solomon (RS) coding scheme), and one or more middle coding schemes. The inner coding scheme is based on a polarization transformation (e.g., polar codes with cyclic redundancy check (CRC) codes, polar codes with dynamic freezing codes, polarization-adjusted convolutional (PAC) codes, etc.) which allows for embedding parity data from an outer code inside a codeword along with the user data. The outer coding scheme has a similar concatenated structure (e.g., of an inner RS code with an outer RS code).

20 Claims, 16 Drawing Sheets

(56) References Cited

U.S. PATENT DOCUMENTS

| | | | |
|---|---|---|---|
| 2017/0123899 A1* | 5/2017 | Zhao | H03M 13/6588 |
| 2018/0358987 A1* | 12/2018 | Zhang | G06F 11/00 |
| 2021/0133028 A1* | 5/2021 | Kim | G06F 11/1048 |
| 2021/0208967 A1* | 7/2021 | Cha | H03M 13/13 |

* cited by examiner

☐ User Data Bits

▨ Inner-Most Code Parity Bits

▨ Middle Code Parity Bits

HIERARCHICAL ERROR CORRECTION CODE DECODING USING MULTISTAGE CONCATENATED CODES

BACKGROUND

The following relates generally to memory devices, and more specifically to hierarchical error correction code decoding using multistage concatenated codes.

Memory devices are commonly used electronic components for storing data. NAND flash memory devices allow several bits of data to be stored in each memory cell, providing improvements in manufacturing costs and performance. A memory cell in which multiple bits of data are stored may be referred to as a multi-level memory cell. A multi-level memory cell partitions a threshold voltage range of a memory cell into several voltage states, and data values written to the memory cell are extracted using the memory cell voltage levels.

In some cases, data may be encoded prior to programming to a memory device in order to provide the ability to correct for read errors. However, many decoders assume an additive white Gaussian noise (AWGN) model, but the noise introduced by Flash memory cells may not be consistent with an AWGN model. Furthermore, error correction decoding schemes can be computationally intensive. For instance, VNAND devices (e.g., vertical NAND devices) increase a number of layers and increase bits per-cells modulation on the NAND (e.g., via vertical stacking of NAND devices). Such may cause a decrease in a NAND signal to noise ratio (SNR) and demand stronger error-correction mechanisms. Therefore, there is a need in the art for improved systems and methods for decoding information stored in a memory device.

SUMMARY

A method, apparatus, non-transitory computer readable medium, and system for hierarchical error code correction (ECC) decoding using multistage concatenated codes are described. One or more aspects of the method, apparatus, non-transitory computer readable medium, and system include receiving information bits for storage in a memory device; generating first parity bits based on the information bits using an outer coding scheme; generating second parity bits based on the information bits and the first parity bits using a middle coding scheme; generating third parity bits based on the information bits, the first parity bits, and the second parity bits using an inner coding scheme; combining the information bits, the first parity bits, the second parity bits, and the third parity bits as a codeword; and storing the codeword in the memory device.

A method, apparatus, non-transitory computer readable medium, and system for hierarchical ECC decoding using multistage concatenated codes are described. One or more aspects of the method, apparatus, non-transitory computer readable medium, and system include retrieving a codeword from a memory of a device; dividing the codeword into plurality of codeword blocks; decoding a codeword block of the plurality of blocks using a middle coding scheme; determining that the decoding of the codeword block using the middle coding scheme failed; obtaining parity bits from other codeword blocks according to an outer coding scheme based on the determination that decoding the codeword block using the middle coding scheme failed; dividing the codeword block into a plurality of codeword rows; decoding a codeword row of the plurality of codeword rows using an inner coding scheme; and transmitting information bits of the codeword from the memory device based on decoding the codeword row.

An apparatus, system, and method for hierarchical ECC decoding using multistage concatenated codes are described. One or more aspects of the apparatus, system, and method include a memory device; an encoder configured to encode information for storage in the memory device using a hierarchical coding scheme including an outer coding scheme, a middle coding scheme, and an inner coding scheme; and a decoder configured to decode the information using the hierarchical coding scheme, wherein parity bits from the outer coding scheme are used when an error is detected in decoding a codeword block using the middle coding scheme, and wherein the inner coding scheme is used to decode codeword rows of the codeword block.

BRIEF DESCRIPTION OF THE DRAWINGS

Features of the present inventive concept will become more apparent by describing in detail embodiments thereof with reference to the accompanying drawings.

DETAILED DESCRIPTION

Figure 1:
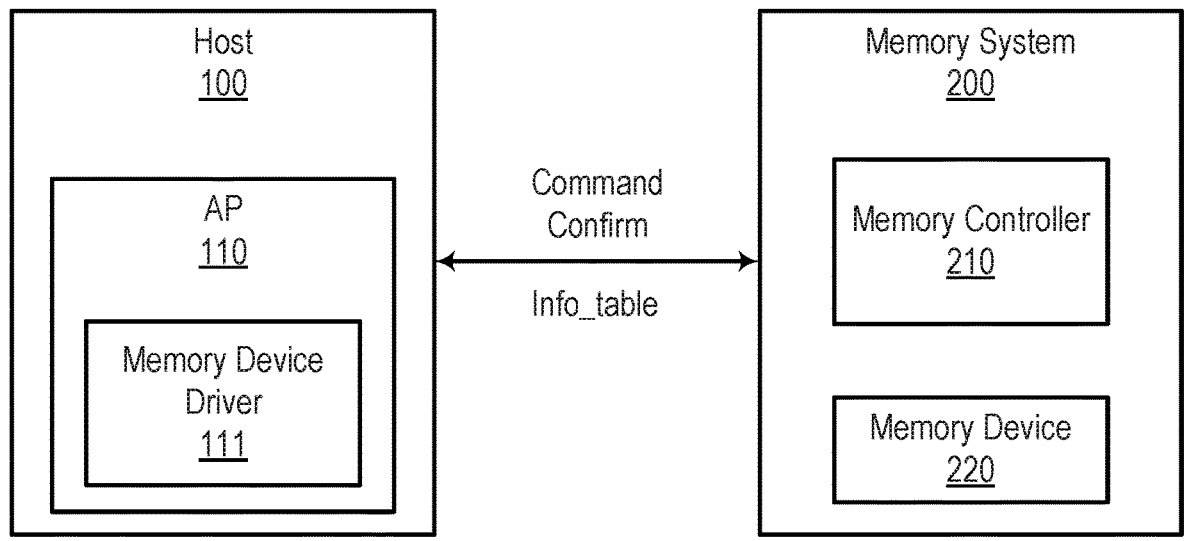
FIG. 1 is a block diagram illustrating an implementation of a data processing system including a memory system, according to an embodiment of the inventive concept.

The present disclosure describes systems and methods for error correction, and more specifically for encoding and decoding a codeword in a memory device using hierarchical coding techniques.

NAND programming is a complex process based on applying a voltage to a memory cell. However, cell voltage may be affected by variables such as current voltage level, pulse power, and inter-cell interferences. Cell voltage may also be affected by inhibited cell disruption, inter-word line (WL) coupling, and cell retention. Additionally, the outcome of writing to a NAND device is stochastic. For example, data may also be noisy, leading to problems with observation.

A decoder is a logic circuit used to convert binary information from coded inputs to unique outputs. Multiple inputs and multiple outputs may be used. Channel coding performs encoding and decoding operations on a data stream to correct communication errors such as interference or noise. Channel coding is performed on a first data stream with a first set of operations at a transmitting device and a second data stream with a second set of operations at a receiving device. Channel coding may be a block code or a convolutional code.

Polar codes are a subset of channel coding. Polar coding is a block code method, where a block of data and bits have a set size. A manipulation to the block is performed at the transmitter and receiver. Operations called Channel Combining and Channel Splitting are performed. First, Channel Combining assigns and/or maps combinations of symbols to channels. Then, Channel Splitting performs a transformation operation, translating symbol combinations into time domain vectors used in the decoder. The decoding operation, with the encoding operation, estimates time domain bit streams. This converts the block of bits and channels into a polarized bit stream at the receiver. Polar codes have been shown to achieve capacity for Additive white Gaussian noise (AWGN) channels and achieve comparable performance to Low-density parity-check code (LDPC) for finite length code using a Successive Cancelation List (SCL) decoder with cyclic redundancy checks (CRC). The SCL decoder has a high latency because each bit is decoded successively.

In solid-state drive (SSD) devices, flash memory controllers are connected to several NAND channels in parallel to achieve high data throughput. The memory controller includes signal processing and Error Correction Code (ECC) engines that decode the data from the NAND and retrieve the stored data reliably. Some hardware architectures may maximize the throughput of the memory system by applying fast reads from the NAND and fast decoding techniques. Additionally, hardware architectures may perform correction methods in, for example, data retention and data corruption. VNAND increases a number of layers and higher bits per-cells modulation on the NAND (e.g., via vertical stacking of NAND devices). Such may cause a decrease in a NAND signal to noise ratio (SNR) and demand stronger error-correction mechanisms. Some methods, such as decoding algorithms, may be used to improve correctability to increase the code word length. However, some methods reduce SSD performance (e.g., reduce input/output operations per second (IOPS)) and may use more complex hardware.

Embodiments of the present disclosure provide architectures and schemes for hierarchical encoding and decoding based on multistage concatenated codes. For instance, multiple encoder and decoder hierarchies may be implemented along with use of corresponding stages of concatenated codes (e.g., where larger code lengths of subsequent hierarchies may be composed of local codes from a lower hierarchy). According to an embodiment, the coding scheme includes an inner coding scheme (e.g., a polar coding scheme, such as a hybrid polar code, a Bose Chaudhuri and Hocquenghem (BCH) code, etc.), an outer coding scheme (e.g., a Reed-Solomon (RS) coding scheme), and one or more middle coding schemes. Thus, the overall coding scheme can include three different coding schemes arranged in a hierarchical structure. In some cases, the hierarchy can include four or more coding schemes arranged at least in part in a hierarchical structure.

According to one embodiment, the inner coding scheme is based on a polarization transformation (e.g., polar codes with cyclic redundancy check (CRC) codes, polar codes with dynamic freezing codes, polarization adjusted convolutional (PAC) codes, etc.) which allows for embedding parity data from an outer code inside a codeword along with the user data. The outer coding scheme has a similar concatenated structure (e.g., of an inner RS code with an outer RS code).

Accordingly, each block of a hierarchical code structure can be decoded independently (e.g., using local parities), while global parities may be extracted to assist the decoder in scenarios where a decoding error is detected for a block. For instance, in cases where a decoding error is detected for a block, the decoders of the individual blocks extract global parities and pass global parities as side-information to amongst the decoders in order to overcome detected errors in the decoding process. As such, the hierarchical structure is configured to achieve high throughput, latency, and correctability performance (e.g., via partial decoding of a frame based on local parities, while maintaining global parities in order to achieve efficient frame error rate (FER) demands).

Embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments unless the context clearly indicates otherwise.

As used herein, the singular forms "a", "an" and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Example Memory System

FIGS. 1-5 show an example memory system according to aspects of the present disclosure. In memory systems (e.g., such as SSD systems), memory controllers are connected to several NAND channels in parallel to achieve high data throughput. Memory controllers include signal processing and ECC engines that decode the data from the NAND and retrieve the stored data reliably. As described herein, the example memory system of FIGS. 1-5 may include a memory controller with multiple encoder and decoder hierarchies (e.g., for implementation of hierarchical ECC encoding and decoding schemes) that may be implemented along with use of multistage concatenated codes.

FIG. 1 is a block diagram illustrating an implementation of a data processing system 10, according to an embodiment of the inventive concept. The data processing system 10 may include a host 100 and a memory system 200. The memory system 200 shown in FIG. 1 may be utilized in various systems that include a data processing function. The various systems may be various devices including, for example, mobile devices, such as a smartphone or a tablet computer. However, the various devices are not limited thereto.

The memory system 200 may include various types of memory devices. Herein, embodiments of the inventive concept will be described as including a memory device that is a non-volatile memory. However, embodiments are not limited thereto. For example, the memory system 200 may include a memory device that is a volatile memory.

According to embodiments, the memory system 200 may include a non-volatile memory device such as, for example, a read-only memory (ROM), a magnetic disk, an optical disk, a flash memory, etc. The flash memory may be a memory that stores data according to a change in a threshold voltage of a metal-oxide-semiconductor field-effect transistor (MOSFET), and may include, for example, NAND and NOR flash memories. The memory system 200 may be implemented using a memory card including a non-volatile memory device such as, for example, an embedded multimedia card (eMMC), a secure digital (SD) card, a micro SD card, or a universal flash storage (UFS), or the memory system 200 may be implemented using, for example, an SSD including a non-volatile memory device. Herein, the configuration and operation of the memory system 200 will be described assuming that the memory system 200 is a non-volatile memory system. However, the memory system 200 is not limited thereto. The host 100 may include, for example, a system-on-chip (SoC) application processor (AP) 110 mounted on, for example, a mobile device, or a central processing unit (CPU) included in a computer system.

According to embodiments, the memory system 200 may include flash memory. Flash memory is an electronic (solid-state) non-volatile computer storage medium that can be electrically erased and reprogrammed. The two main types of flash memory are named after the NAND and NOR logic gates. The individual flash memory cells exhibit internal characteristics similar to those of the corresponding gates. Where EPROMs had to be completely erased before being rewritten, NAND-type flash memory may be written and read in blocks (or pages) which are generally much smaller than the entire device. NOR-type flash allows a single machine word (byte) to be written—to an erased location—or read independently. The NAND type operates primarily in memory cards, USB flash drives, solid-state drives (those produced in 2009 or later), and similar products, for general storage and transfer of data. NAND or NOR flash memory is also often used to store configuration data in numerous digital products, a task previously made possible by EEPROM or battery-powered static RAM. One key disadvantage of flash memory is that it can only endure a relatively small number of write cycles in a specific block. Example applications of both types of flash memory include personal computers, PDAs, digital audio players, digital cameras, mobile phones, synthesizers, video games, scientific instrumentation, industrial robotics, and medical electronics.

In addition to being non-volatile, flash memory offers fast read access times, although not as fast as static RAM or ROM. Its mechanical shock resistance helps explain its popularity over hard disks in portable devices, as does its high durability, ability to withstand high pressure, temperature and immersion in water, etc. Although flash memory is technically a type of EEPROM, the term "EEPROM" is generally used to refer specifically to non-flash EEPROM which is erasable in small blocks, typically bytes. Because erase cycles are slow, the large block sizes used in flash memory erasing give it a significant speed advantage over non-flash EEPROM when writing large amounts of data. Flash memory costs much less than byte-programmable EEPROM and had become the dominant memory type wherever a system required a significant amount of non-volatile solid-state storage. Flash memory stores information in an array of memory cells made from floating-gate transistors. In single-level cell (SLC) devices, each cell stores only one bit of information. In multi-level cell (MLC) devices, including triple-level cell (TLC) devices, can store more than one bit per cell. The floating gate may be conductive or non-conductive.

A processor is an intelligent hardware device (e.g., a general-purpose processing component, a digital signal processor (DSP), a CPU, a graphics processing unit (GPU), a microcontroller, an application specific integrated circuit (ASIC), a field programmable gate array (FPGA), a programmable logic device, a discrete gate or transistor logic component, a discrete hardware component, or any combination thereof). In some cases, the processor is configured to operate a memory array using a memory controller. In other cases, a memory controller is integrated into the processor. In some cases, the processor is configured to execute computer-readable instructions stored in a memory to perform various functions. In some embodiments, a processor includes special purpose components for modem processing, baseband processing, digital signal processing, or transmission processing.

As described above, the host 100 may include an AP 110. The AP 110 may include various intellectual property (IP) blocks. For example, the AP 110 may include a memory device driver 111 that controls the memory system 200. The host 100 may communicate with the memory system 200 to transmit a command related to a memory operation and receive a confirm command in response to the transmitted command. The host 100 may also communicate with the memory system 200 with regard to an information table related to the memory operation.

The memory system 200 may include, for example, a memory controller 210 and a memory device 220. The memory controller 210 may receive a command related to a memory operation from the host 100, generate an internal command and an internal clock signal using the received command, and provide the internal command and the internal clock signal to the memory device 220. The memory device 220 may store write data in a memory cell array in response to the internal command or may provide read data to the memory controller 210 in response to the internal command.

As described herein, a memory controller 210 may include a hierarchical encoding and decoding architecture. For instance, memory controller 210 may include a hierarchical ECC structure implementing an inner coding scheme (e.g., a polar coding scheme, such as a hybrid polar code), an outer coding scheme (e.g., a RS coding scheme), and one or more middle coding schemes. The inner coding scheme is based on a polarization transformation (e.g., polar codes with CRC codes, polar codes with dynamic freezing codes, PAC codes, etc.) which allows for embedding parity data from an outer code inside a codeword along with the user data. The outer coding scheme has a similar concatenated structure (e.g., of an inner RS code with an outer RS code). As described in more detail herein, the hierarchical structure of the ECC allows decoding of a part of the entire frame based on local parities, while maintaining further global parities for improved throughput, latency, and FER capabilities.

Figure 4:
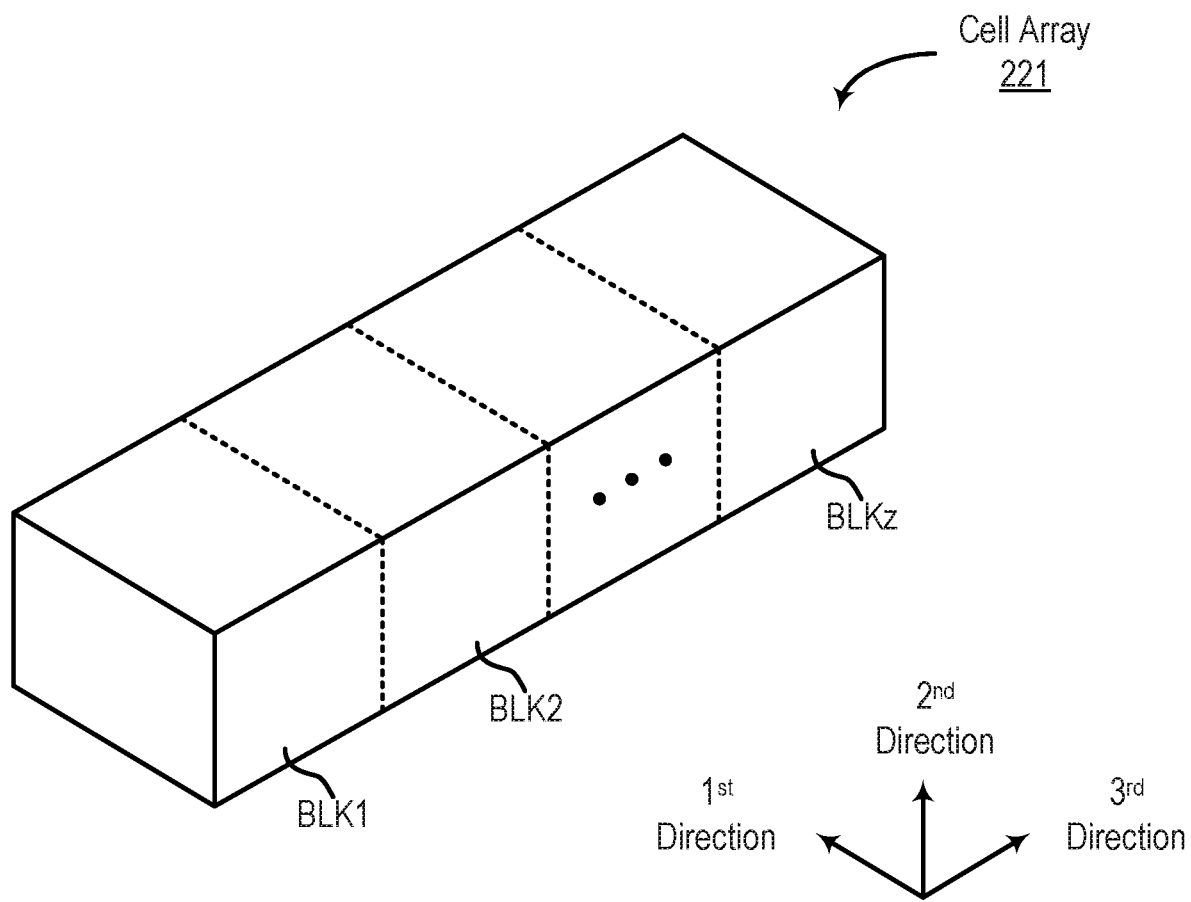
FIG. 4 is a block diagram of the memory cell array of FIG. 2, according to an embodiment of the inventive concept.

The memory device 220 includes a memory cell array that retains data stored therein, even when the memory device 220 is not powered on. The memory cell array may include as memory cells, for example, a NAND or NOR flash memory, a magneto-resistive random-access memory (MRAM), a resistive random-access memory (RRAM), a ferroelectric access-memory (FRAM), or a phase change memory (PCM). For example, when the memory cell array includes a NAND flash memory, the memory cell array may include a plurality of blocks and a plurality of pages. Data may be programmed and read in units of pages, and data may be erased in units of blocks. An example of memory blocks included in a memory cell array is shown in FIG. 4.

Figure 2:
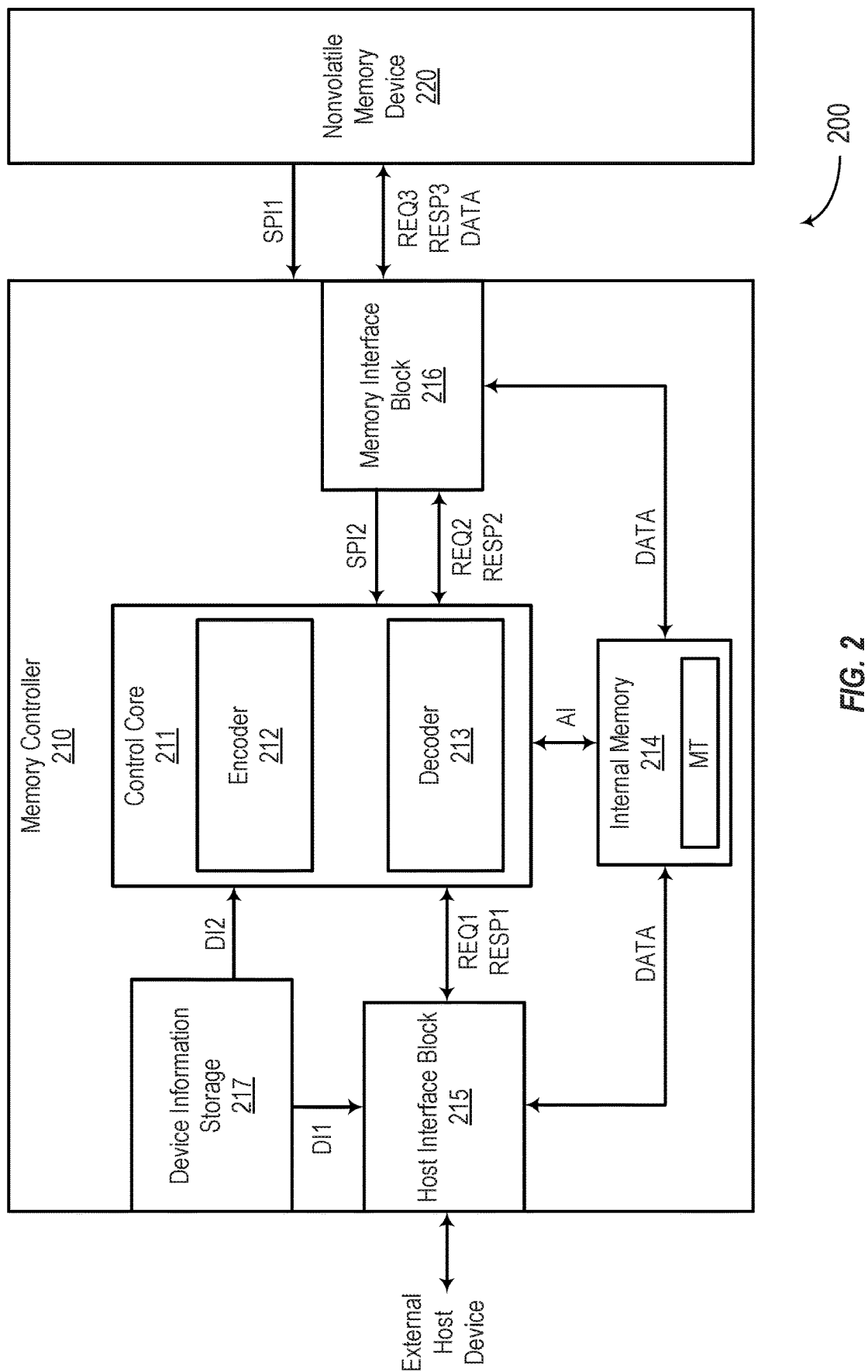
FIG. 2 is a block diagram illustrating the memory system of FIG. 1, according to an embodiment of the inventive concept.

FIG. 2 is a block diagram illustrating the memory system 200 of FIG. 1, according to an embodiment of the inventive concept. Referring to FIG. 2, the memory system 200 includes the memory device 220 and the memory controller 210. The memory controller 210 may also be referred to herein as a controller circuit. The memory device 220 may perform a write operation, a read operation, or an erase operation under control of the memory controller 210.

The memory controller 210 may control the memory device 220 depending on a request received from the host 100 or an internally designated schedule. The memory controller 210 may include a controller core 211, an internal memory 214, a host interface block 215, and a memory interface block 216. The memory controller 210 may also include a device information storage 217 configured provide first device information DI1 to the host interface block 215 and second device information DI2 to the controller core 211.

The controller core 211 may include an encoder 212 and a decoder 213. Encoder 212 is an example of, or includes aspects of, the corresponding element described with reference to FIG. 7. Decoder 213 is an example of, or includes aspects of, the corresponding elements described with reference to FIGS. 14-16. The memory control core may control and access the memory device 220 depending on a request received from the host 100 or an internally designated schedule. The memory control core may manage and execute various metadata and codes used to manage or operate the memory system 200. In some embodiments, the controller core 211 may include a memory control core and a machine learning core, and each of these cores may be implemented by one or more processors.

In some examples, memory controller 210 may include a machine learning core. The machine learning core may be used to perform training and inference of a neural network (e.g., a neural network that is designed to perform noise cancellation on the memory device 220).

The internal memory 214 may be used, for example, as a system memory which is used by the controller core 211, a cache memory which stores data of the memory device 220, or a buffer memory which temporarily stores data between the host 100 and the memory device 220. The internal memory 214 may store a mapping table MT that indicates a relationship between logical addresses assigned to the memory system 200 and physical addresses of the memory device 220. The internal memory 214 may include, for example, a DRAM or an SRAM.

The host interface block 215 may include a component for communicating with the host 100 such as, for example, a physical block. The memory interface block 216 may include a component for communicating with the memory device 220 such as, for example, a physical block.

Below, an operation of the memory system 200 over time will be described. When power is supplied to the memory system 200, the memory system 200 may perform initialization with the host 100.

The host interface block 215 may provide the memory control core with a first request REQ1 received from the host 100. The first request REQ1 may include a command (e.g., a read command or a write command) and a logical address. The memory control core may translate the first request REQ1 to a second request REQ2 suitable for the memory device 220.

For example, the memory control core may translate a format of the command. The memory control core may obtain address information AI with reference to the mapping table MT stored in the internal memory 214. The memory control core may translate a logical address to a physical address of the memory device 220 by using the address information AI. The memory control core may provide the second request REQ2 suitable for the memory device 220 to the memory interface block 216.

The memory interface block 216 may register the second request REQ2 from the memory control core at a queue. The memory interface block 216 may transmit a request that is first registered at the queue to the memory device 220 as a third request REQ3.

When the first request REQ1 is a write request, the host interface block 215 may write data received from the host 100 to the internal memory 214. When the third request REQ3 is a write request, the memory interface block 216 may transmit data stored in the internal memory 214 to the memory device 220.

When data is completely written, the memory device 220 may transmit a third response RESP3 to the memory interface block 216. In response to the third response RESP3, the memory interface block 216 may provide the memory control core with a second response RESP2, indicating that the data is completely written.

After the data is stored in the internal memory 214 or after the second response RESP2 is received, the memory control core may transmit a first response RESP1 indicating that the request is completed to the host 100 through the host interface block 215.

When the first request REQ1 is a read request, the read request may be transmitted to the memory device 220 through the second request REQ2 and the third request REQ3. The memory interface block 216 may store data received from the memory device 220 in the internal memory 214. When data is completely transmitted, the memory device 220 may transmit the third response RESP3 to the memory interface block 216.

As the third response RESP3 is received, the memory interface block 216 may provide the memory control core with the second response RESP2 indicating that the data is completely stored. As the second response RESP2 is received, the memory control core may transmit the first response RESP1 to the host 100 through the host interface block 215.

The host interface block 215 may transmit data stored in the internal memory 214 to the host 100. In an embodiment, in the case in which data corresponding to the first request REQ1 is stored in the internal memory 214, the transmission of the second request REQ2 and the third request REQ3 may be omitted.

The memory device 220 may also transmit first Serial Peripheral Interface information SPI1 to the memory interface block 216. The memory interface block 216 may transmit second Serial Peripheral Interface information SPI2 to the controller core 211.

Memory system 200 may include memory device 220 and memory controller 210 (e.g., the memory controller 210 including encoder 212 and decoder 213) configured to perform techniques described herein. According to some aspects, encoder 212 is configured to encode information for storage in the memory device 220 using a hierarchical coding scheme including an outer coding scheme, a middle coding scheme, and an inner coding scheme. According to some aspects, decoder 213 is configured to decode the information using the hierarchical coding scheme, wherein parity bits from the outer coding scheme are used when an error is detected in decoding a codeword block using the middle coding scheme, and wherein the inner coding scheme is used to decode codeword rows of the codeword block.

In some aspects, the decoder 213 is configured to perform a soft RS algorithm for the outer coding scheme. In some aspects, the decoder 213 is configured to perform a RS algorithm configured for the middle coding scheme, where the RS algorithm of the middle coding scheme is configured for use together with the inner coding scheme. In some aspects, the decoder 213 is configured to use a polar coding scheme for the inner coding scheme. In some aspects, the decoder 213 includes a low complexity polar decoder 213 and a high complexity polar decoder 213 for the inner coding scheme.

According to some aspects, memory controller 210 receives information bits for storage in a memory device 220. According to some aspects, encoder 212 generates first parity bits based on the information bits using an outer coding scheme. In some examples, encoder 212 generates second parity bits based on the information bits and the first parity bits using a middle coding scheme. In some examples, encoder 212 generates third parity bits based on the information bits, the first parity bits, and the second parity bits using an inner coding scheme. In some examples, encoder 212 combines the information bits, the first parity bits, the second parity bits, and the third parity bits as a codeword. According to some aspects, memory device 220 stores the codeword (e.g., the memory controller 210 stores the codeword in the memory device 220).

In some examples, encoder 212 assigns position information to the information bits, where the position information includes a row index and a column index, where the first parity bits are generated column-wise based on the position information, and where the second parity bits are generated row-wise based on the position information. In some examples, encoder 212 alternately encodes columns and rows of a block of the information bits using the middle coding scheme. In some examples, encoder 212 encodes a row including a portion of the information bits, a portion of the first parity bits, a portion of the second parity bits, and a first portion of the third parity bits from a previous row using the inner coding scheme to obtain an encoded row and a second portion of the third parity bits for a next row. In some aspects, the outer coding scheme includes a RS coding scheme. In some aspects, the middle coding scheme includes a RS coding scheme. In some aspects, the inner coding scheme includes a polar coding scheme.

According to some aspects, memory controller 210 retrieves a codeword from a memory of a device. According to some aspects, decoder 213 divides the codeword into set of codeword blocks. In some examples, decoder 213 decodes a codeword block of the set of blocks using a middle coding scheme. In some examples, decoder 213 determines that the decoding of the codeword block using the middle coding scheme failed. In some examples, decoder 213 obtains parity bits from other codeword blocks according to an outer coding scheme based on the determination that decoding the codeword block using the middle coding scheme failed. In some examples, decoder 213 divides the codeword block into a set of codeword rows. In some examples, decoder 213 decodes a codeword row of the set of codeword rows using an inner coding scheme. In some examples, memory controller 210 transmits information bits of the codeword from the memory device 220 based on decoding the codeword row.

In some examples, decoder 213 performs soft decoding of the codeword using the outer coding scheme based on the determination that decoding the codeword using the outer coding scheme failed. In some examples, decoder 213 decodes the codeword row using a low complexity decoder 213 of the inner coding scheme. In some examples, decoder 213 determines that decoding the codeword row using the low complexity decoder 213 failed. In some examples, decoder 213 decodes the codeword row using a high complexity decoder 213. In some aspects, the low complexity decoder 213 includes a successive cancellation decoder 213 or a belief propagation decoder 213. In some aspects, the high complexity algorithm includes a stepped list decoder 213 or a sequential decoder 213. In some aspects, the outer coding scheme includes a RS coding scheme. In some aspects, the middle coding scheme includes a RS coding scheme. In some aspects, the inner coding scheme includes a polar coding scheme.

Figure 3:
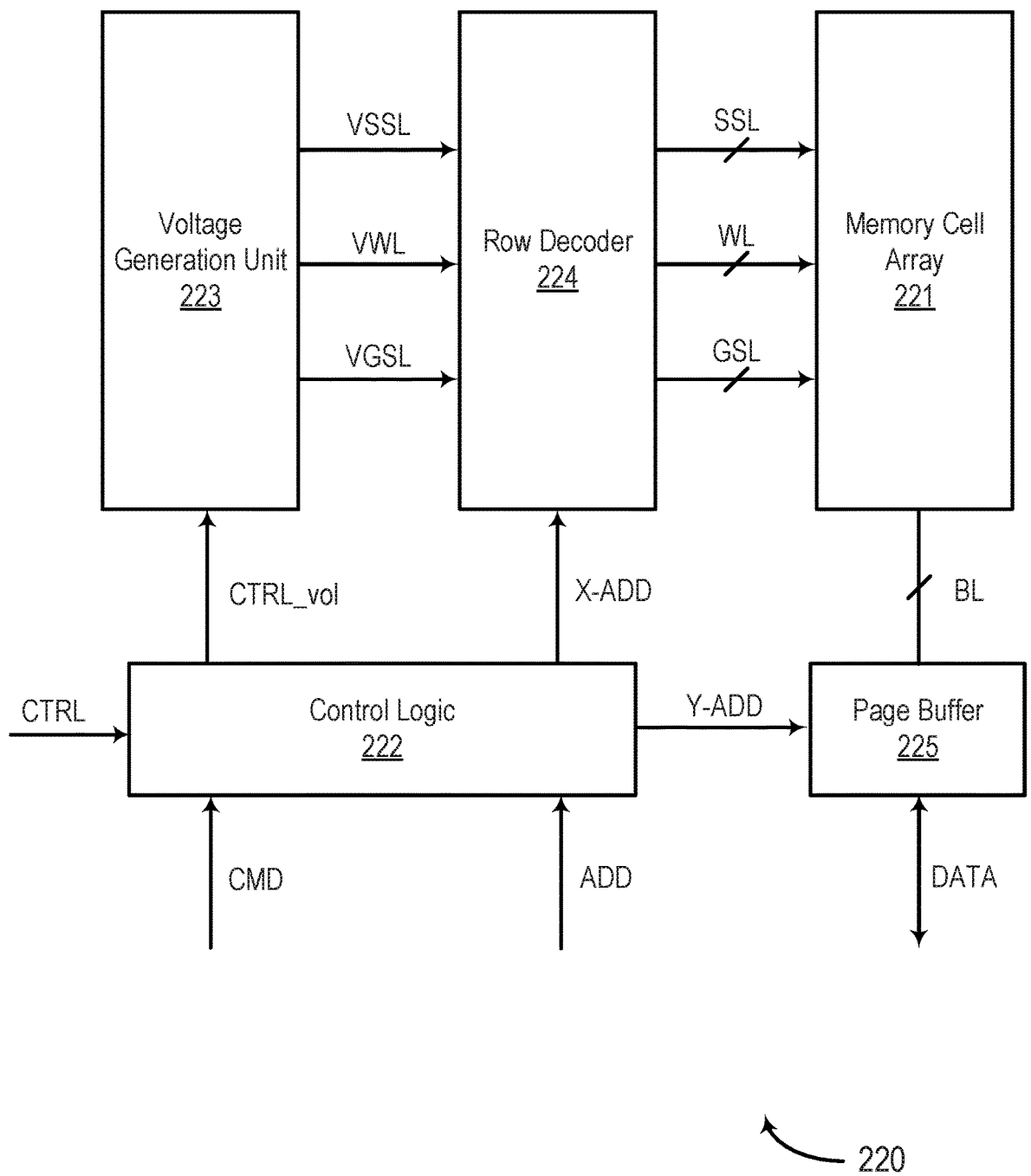
FIG. 3 is a detailed block diagram of a non-volatile memory device of FIG. 1, according to an embodiment of the inventive concept.

FIG. 3 is a detailed block diagram of the non-volatile memory device 220 of FIG. 1, according to an embodiment of the inventive concept. Referring to FIG. 3, the memory device 220 may include, for example, a memory cell array 221, a control logic 222, a voltage generation unit 223, a row decoder 224, and a page buffer 225.

The memory cell array 221 may be connected to one or more string select lines SSL, a plurality of word lines WL, one or more ground select lines GSL, and a plurality of bit lines BL. The memory cell array 221 may include a plurality of memory cells disposed at intersections between the plurality of word lines WL and the plurality of bit lines BL.

The control logic 222 may receive a command CMD (e.g., an internal command) and an address ADD from the memory controller 210 and receive a control signal CTRL for controlling various functional blocks within the memory device 220 from the memory controller 210. The control logic 222 may output various control signals for writing data to the memory cell array 221 or reading data from the memory cell array 221, based on the command CMD, the address ADD, and the control signal CTRL. In this manner, the control logic 222 may control the overall operation of the memory device 220.

The various control signals output by the control logic 222 may be provided to the voltage generation unit 223, the row decoder 224, and the page buffer 225. For example, the control logic 222 may provide the voltage generation unit 223 with a voltage control signal CTRL_vol, provide the row decoder 224 with a row address X-ADD, and provide the page buffer 225 with a column address Y-ADD.

The voltage generation unit 223 may generate various voltages for performing program, read, and erase operations on the memory cell array 221 based on the voltage control signal CTRL_vol. For example, the voltage generation unit 223 may generate a first driving voltage VWL for driving the plurality of word lines WL, a second driving voltage VSSL for driving the plurality of string select lines SSL, and a third driving voltage VGSL for driving the plurality of ground select lines GSL. In this case, the first driving voltage VWL may be a program voltage (e.g., a write voltage), a read voltage, an erase voltage, a pass voltage, or a program verify voltage. In addition, the second driving voltage VSSL may be a string select voltage (e.g., an on voltage or an off voltage). Further, the third driving voltage VGSL may be a ground select voltage (e.g., an on voltage or an off voltage).

The row decoder 224 may be connected to the memory cell array 221 through the plurality of word lines WL, and may activate a part of the plurality of word lines WL in response to the row address X-ADD received from the control logic 222. For example, in a read operation, the row decoder 224 may apply a read voltage to a selected word line and a pass voltage to unselected word lines.

In a program operation, the row decoder 224 may apply a program voltage to a selected word line and a pass voltage to unselected word lines. In an embodiment, in at least one of a plurality of program loops, the row decoder 224 may apply the program voltage to the selected word line and an additionally selected word line.

The page buffer 225 may be connected to the memory cell array 221 through the plurality of bit lines BL. For example, in a read operation, the page buffer 225 may operate as a sense amplifier that outputs data stored in the memory cell array 221. Alternatively, in a program operation, the page buffer 225 may operate as a write driver that writes desired data to the memory cell array 221.

Figure 5:
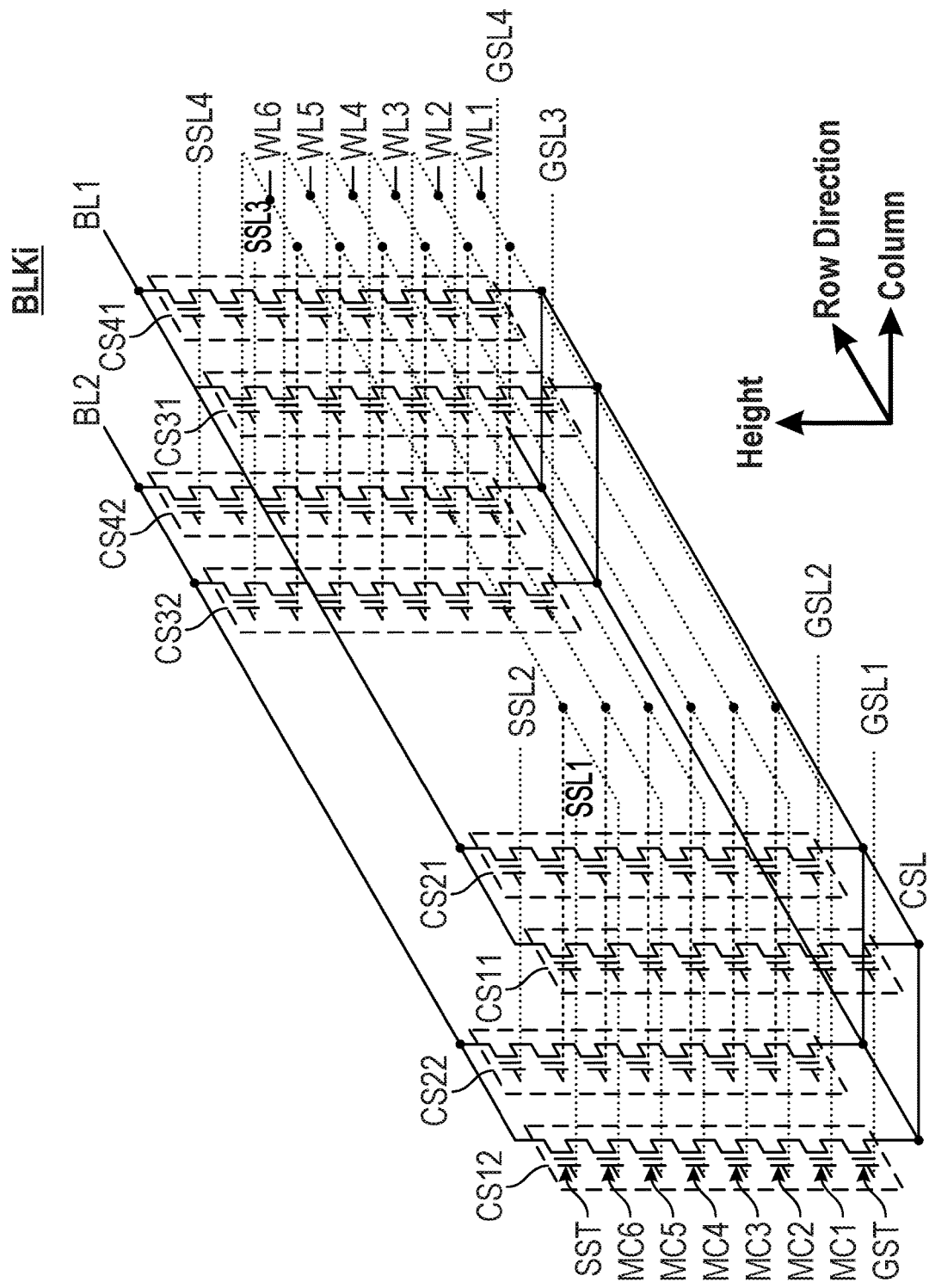
FIG. 5 is a circuit diagram of a memory block of the memory cell array of FIG. 4, according to an embodiment of the inventive concept.

FIGS. 4 and 5 illustrate an example in which the memory system 200 is implemented using a three-dimensional flash memory. The three-dimensional flash memory may include three-dimensional (e.g., vertical) NAND (e.g., VNAND) memory cells. An implementation of the memory cell array 221 including three-dimensional memory cells is described below. Each of the memory cells described below may be a NAND memory cell.

FIG. 4 is a block diagram of the memory cell array 221 of FIG. 2, according to an embodiment of the inventive concept. Referring to FIG. 4, the memory cell array 221, according to an embodiment, includes a plurality of memory blocks BLK1 to BLKz. Each of the memory blocks BLK1 to BLKz has a three-dimensional structure (e.g., a vertical structure). For example, each of the memory blocks BLK1 to BLKz may include structures extending in first to third directions. For example, each of the memory blocks BLK1 to BLKz may include a plurality of NAND strings extending in the second direction. The plurality of NAND strings may be provided, for example, in the first to third directions.

Each of the NAND strings is connected to a bit line BL, a string select line SSL, a ground select line GSL, word lines WL, and a common source line CSL. That is, each of the memory blocks BLK1 to BLKz may be connected to a plurality of bit lines BL, a plurality of string select lines SSL, a plurality of ground select lines GSL, a plurality of word lines WL, and a common source line CSL. The memory blocks BLK1 to BLKz will be described in further detail below with reference to FIG. 5.

FIG. 5 is a circuit diagram of a memory block BLKi according to an embodiment of the inventive concept. FIG. 5 illustrates an example of one of the memory blocks BLK1 to BLKz in the memory cell array 221 of FIG. 4. Although FIG. 5 illustrates an example with 6 word lines and memory cells, this is just an illustration and any number of word lines and memory cells may be used.

The memory block BLKi may include a plurality of cell strings CS11 to CS41 and CS12 to CS42. The plurality of cell strings CS11 to CS41 and CS12 to CS42 may be arranged in column and row directions to form columns and rows. Each of the cell strings CS11 to CS41 and CS12 to CS42 may include a ground select transistor GST, memory cells MC1 to MC6, and a string select transistor SST. The ground select transistor GST, the memory cells MC1 to MC6, and the string select transistor SST, which are included in each of the cell strings CS11 to CS41 and CS12 to CS42, may be stacked in a height direction substantially perpendicular to a substrate.

The columns of the plurality of cell strings CS11 to CS41 and CS12 to CS42 may be connected to different string select lines SSL1 to SSL4, respectively. For example, the string select transistors SST of the cell strings CS11 and CS12 may be commonly connected to the string select line SSL1. The string select transistors SST of the cell strings CS21 and CS22 may be commonly connected to the string select line SSL2. The string select transistors SST of the cell strings CS31 and CS32 may be commonly connected to the string select line SSL3. The string select transistors SST of the cell strings CS41 and CS42 may be commonly connected to the string select line SSL4.

The rows of the plurality of cell strings CS11 to CS41 and CS12 to CS42 may be connected to different bit lines BL1 and BL2, respectively. For example, the string select transistors SST of the cell strings CS11 to CS41 may be commonly connected to the bit line BL1. The string select transistors SST of the cell strings CS12 to CS42 may be commonly connected to the bit line BL2.

The columns of the plurality of cell strings CS11 to CS41 and CS12 to CS42 may be connected to different ground select lines GSL1 to GSL4, respectively. For example, the ground select transistors GST of the cell strings CS11 and CS12 may be commonly connected to the ground select line GSL1. The ground select transistors GST of the cell strings CS21 and CS22 may be commonly connected to the ground select line GSL2. The ground select transistors GST of the cell strings CS31 and CS32 may be commonly connected to the ground select line GSL3. The ground select transistors GST of the cell strings CS41 and CS42 may be commonly connected to the ground select line GSL4.

The memory cells disposed at the same height from the substrate (or the ground select transistors GST) may be commonly connected to a single word line, and the memory cells disposed at different heights from the substrate may be connected to different word lines WL1 to WL6, respectively. For example, the memory cells MC1 may be commonly connected to the word line WL1. The memory cells MC2 may be commonly connected to the word line WL2. The memory cells MC3 may be commonly connected to the word line WL3. The memory cells MC4 may be commonly connected to the word line WL4. The memory cells MC5 may be commonly connected to the word line WL5. The memory cells MC6 may be commonly connected to the word line WL6. The ground select transistors GST of the cell strings CS11 to CS41 and CS12 to CS42 may be commonly connected to the common source line CSL.

Example Encoder

Figure 6:
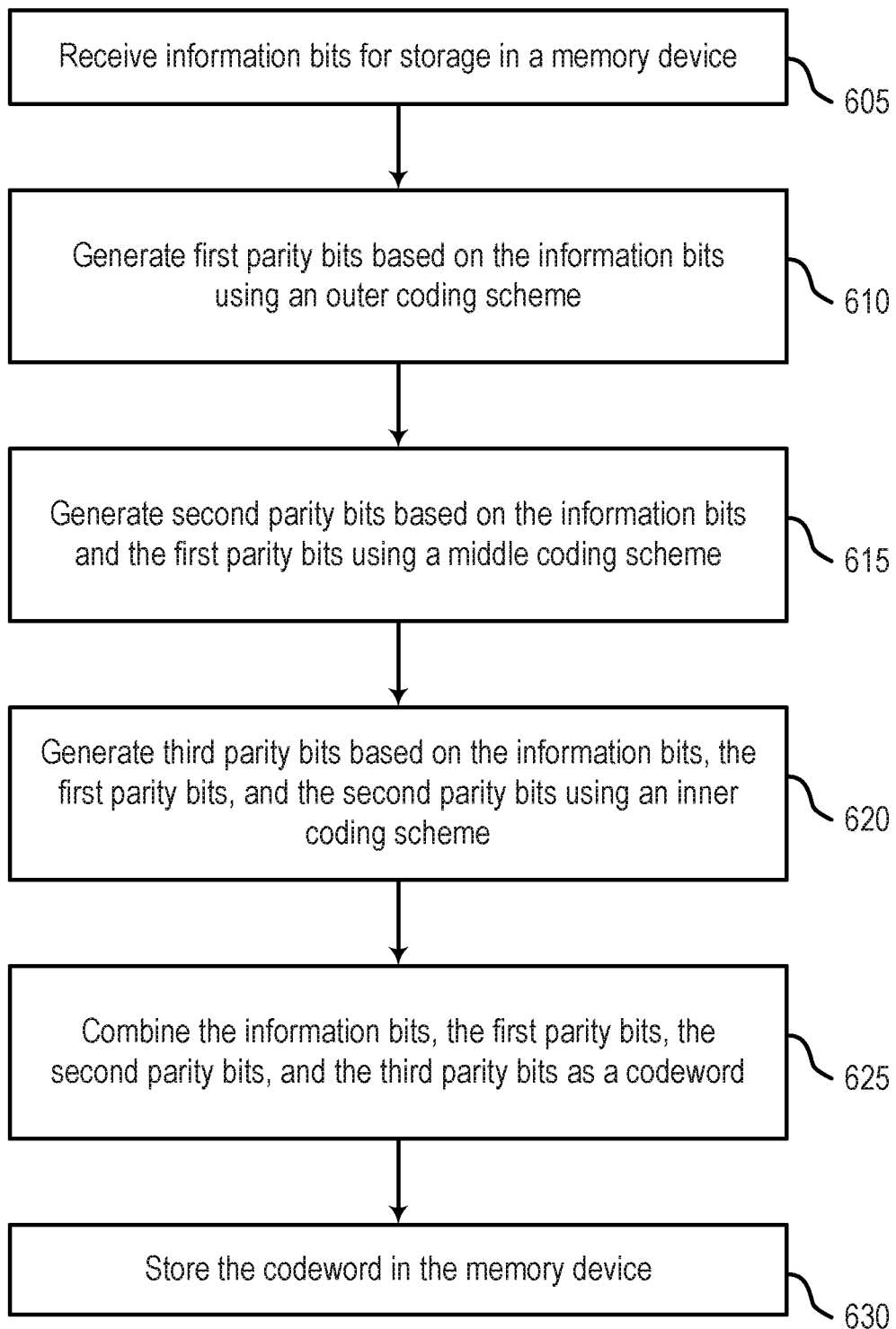
FIG. 6 shows an example of a process for error code correction (ECC) according to aspects of the present disclosure.

FIG. 6 shows an example of 600 for error code correction according to aspects of the present disclosure. In some examples, these operations are performed by a system including a processor executing a set of codes to control functional elements of an apparatus. Additionally or alternatively, certain processes are performed using special-purpose hardware. Generally, these operations are performed according to the methods and processes described in accordance with aspects of the present disclosure. In some cases, the operations described herein are composed of various substeps, or are performed in conjunction with other operations.

A method for hierarchical ECC encoding using multistage concatenated codes is described. One or more aspects of the method include receiving information bits for storage in a memory device, generating first parity bits based on the information bits using an outer coding scheme, generating second parity bits based on the information bits and the first parity bits using a middle coding scheme, and generating third parity bits based on the information bits, the first parity bits, and the second parity bits using an inner coding scheme. One or more aspects of the method further include combining the information bits, the first parity bits, the second parity bits, and the third parity bits as a codeword, and storing the codeword in the memory device.

At operation 605, the system receives information bits for storage in a memory device. For example, a memory controller may receive information bits (e.g., user data) to be encoded (e.g., for transmission to another device). In some cases, the operations of this step refer to, or may be performed by, memory controller as described with reference to FIG. 2.

At operation 610, the system generates first parity bits based on the information bits using an outer coding scheme. For instance, during an encoding process, parity bits may be added to a string of information bits as a form of error correction code (e.g., to make communication of the information bits between a sender and a receiver more robust to noise, signal loss, etc.). The outer coding scheme of operation 610 may allow for embedding parity data (e.g., from the outer code) inside the codeword along with the information bits. In some cases, the operations of this step refer to, or may be performed by, encoder as described with reference to FIGS. 2 and 7. Moreover, aspects of the outer coding scheme are described in more detail herein, for example, with reference to FIGS. 11, 12, 14, and 15.

At operation 615, the system generates second parity bits based on the information bits and the first parity bits using a middle coding scheme. In some cases, the operations of this step refer to, or may be performed by, encoder as described with reference to FIGS. 2 and 7. Moreover, aspects of the middle coding scheme are described in more detail herein, for example, with reference to FIG. 10.

At operation 620, the system generates third parity bits based on the information bits, the first parity bits, and the second parity bits using an inner coding scheme. In some cases, the operations of this step refer to, or may be performed by, encoder as described with reference to FIGS. 2 and 7. Moreover, aspects of the outer coding scheme are described in more detail herein, for example, with reference to FIGS. 8, 9, and 16.

Accordingly, at operation 625, the system combines the information bits, the first parity bits, the second parity bits, and the third parity bits as a codeword. For instance, the inner coding scheme may be based on a polarization transformation that allows for embedding parity data from operations 610 and 615 inside a codeword along with the information bits. In some cases, the operations of this step refer to, or may be performed by, encoder as described with reference to FIGS. 2 and 7.

As described in more detail herein, such a nested coding scheme described with reference to operations 610 through 620 may achieve high throughput, latency, and correctability performance at a decoder for improved communication of the information bits (e.g., as a decoder may perform partial decoding of a frame based on local parities, while maintaining global parities from the outer coding scheme in order to achieve efficient FER demands).

That is, the outer coding scheme of operation 610 enables the overcoming of potential errors by a decoder that may result from aspects of the inner coding scheme of operation 620 (e.g., by sharing parities between decoders of the outer code and the inner code).

At operation 630, the system stores the codeword in the memory device. For instance, in some examples, information bits may be encoded into a codeword for transmission to another device (e.g., to be decoded by another device). In some cases, the operations of this step refer to, or may be performed by, memory device as described with reference to FIG. 2.

Further, an apparatus, a non-transitory computer readable medium, and a system for hierarchical ECC encoding using multistage concatenated codes is described. One or more aspects of the apparatus, non-transitory computer readable medium, and system include receiving information bits for storage in a memory device; generating first parity bits based on the information bits using an outer coding scheme; generating second parity bits based on the information bits and the first parity bits using a middle coding scheme; generating third parity bits based on the information bits, the first parity bits, and the second parity bits using an inner coding scheme; combining the information bits, the first parity bits, the second parity bits, and the third parity bits as a codeword; and storing the codeword in the memory device.

Some examples of the method, apparatus, non-transitory computer readable medium, and system further include assigning position information to the information bits, wherein the position information includes a row index and a column index, wherein the first parity bits are generated column-wise based on the position information, and wherein the second parity bits are generated row-wise based on the position information.

Some examples of the method, apparatus, non-transitory computer readable medium, and system further include alternately encoding columns and rows of a block of the information bits using the middle coding scheme.

Some examples of the method, apparatus, non-transitory computer readable medium, and system further include encoding a row including a portion of the information bits, a portion of the first parity bits, a portion of the second parity bits, and a first portion of the third parity bits from a previous row using the inner coding scheme to obtain an encoded row and a second portion of the third parity bits for a next row.

In some aspects, the outer coding scheme comprises a RS coding scheme. In some aspects, the middle coding scheme comprises a RS coding scheme. In some aspects, the inner coding scheme comprises a polar coding scheme.

Figure 7:
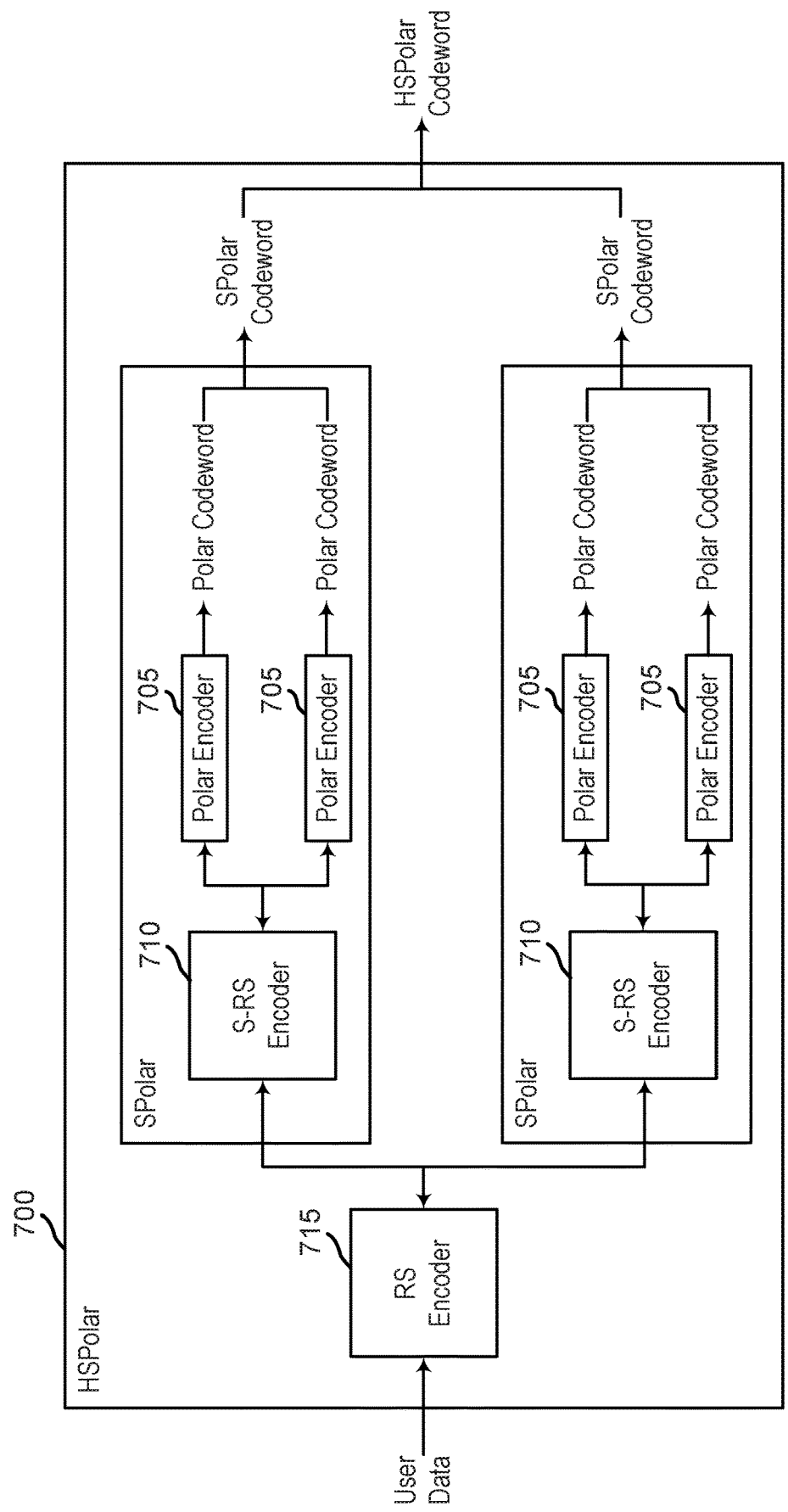
FIG. 7 shows an example of a hierarchical encoding scheme according to aspects of the present disclosure.

FIG. 7 shows an example of a hierarchical encoding scheme according to aspects of the present disclosure. Encoder 700 is an example of, or includes aspects of, the corresponding element described with reference to FIG. 2. In one aspect, encoder 700 includes inner encoders 705, middle encoders 710, and outer encoders 715. Aspects of the example hierarchal encoder architectures described herein may be modified by analogy, without departing from the scope of the present disclosure. The exact architecture may be selected depending on the controller settings. The number of hierarchies, the encoder operation modes, and complexity may depend on the controller target and may be different for mobile controllers, Client-SSD controllers, Data-Center controllers, etc. The architecture parameters trade-offs may be selected for low or high cost controllers. Additionally, the architecture parameters may be selected for current and future controllers.

The present disclosure describes systems and methods for developing a high correct-ability ECC engine with low gate-count and low power. As shown in the example of FIG. 7, encoder 700 includes inner encoders 705 implementing an inner coding scheme (e.g., a polar coding scheme), middle encoders 710 implementing a middle coding scheme (e.g., a RS coding scheme), and outer encoders 715 implementing an outer coding scheme (e.g., a RS coding scheme). Accordingly, encoder 700 may encode user data into a codeword (e.g., an HSPolar codeword), as described in more detail herein.

For instance, embodiments of the disclosure include a generalized concatenated code (GCC) which comprises an inner code to encode a codeword and an outer code with a soft-decoding algorithm. In some cases, the codeword is divided to provide the low gate-count and low power consumption. In some examples, the inner code may be polar code or PAC code. Additionally, a coding scheme incorporating algebraic Reed-Solomon codes may be part of the outer code which combines the divided codewords and increases the correct-ability. In some examples, the decoding algorithm may be in a hierarchical code structure to support high speed decoding (e.g., as described in more detail herein, for example, with reference to FIGS. 13-16).

As described herein, ECC and decoding operations may be performed on a data stream to correct communication errors such as interference or noise. A polar code is a linear block error-correcting code based on a multiple recursive concatenation of a short kernel code that transforms the physical channel into multiple virtual outer channels. The virtual channels tend to either have high reliability or low reliability (i.e., they polarize). Data bits are allocated to the most reliable channels, and unreliable channels are "frozen" or set to 0.

RS codes also operate on a block of data, which is treated as a set of finite field elements called symbols. An RS encoding scheme involves adding check symbols to the data. Using the check symbols, an RS code can detect erroneous symbols.

A hybrid polar code (e.g., which may be referred to herein as an SPolar code) is based on a polar code and RS code concatenation. Features of the SPolar code include high performance and easy scalability with overheads and code sizing. SPolar codes may use a multi-stage encoding process. Multiple RS codes may be encoded in parallel, symbol by symbol. A hierarchical code that utilizes a hybrid polar code can be referred to as an HSPolar code.

GCCs are based on a set of outer codes and a set of nested inner codes. In such cases, an encoding scheme may include encoding data with outer codes to obtain codewords, where a linear binary code may then be generated based on encoding the obtained codeword using the set of nested inner codes. For GCC with polar code, the feedback data includes the frozen bits or the RS polynomial evaluations.

The present disclosure describes systems and methods for ECC encoding and decoding schemes that are based on multistage concatenated codes. In some cases, the ECC has a hierarchical structure to increase throughput and latency. For example, the hierarchical structure may provide for decoding a part of the entire frame based on local parities and contain global parities to reduce the frame error rate (FER). Embodiments of the disclosure include a coding scheme that comprises an inner-most code and an outermost code. For instance, referring to FIG. 7, encoder 700 may include inner encoders 705, middle encoders 710, and outer encoders 715 (e.g., which may implement an inner code, a middle code, and an outer code, respectively).

In some cases, the innermost code may be referred to as an SPolar code or a hybrid Bose Chaudhuri and Hocquenghem (BCH). In some examples, the innermost and basic coded element in the system may be based on polarization transformation. For example, the element may be based on polar with a cyclic redundancy check (i.e., polar+CRC, polar+dynamic frozen and/or PAC codes). As a result, a nested coding scheme is developed that provides for embedding parity data from an outer code inside the codeword with user data.

The outer code reduces errors of the inner code by sharing parities between decoders of the inner code.

One or more embodiments of the disclosure include an outer code (referred to as S-RS) with a concatenated structure similar to an inner Reed-Solomon (RS) code with an outer RS code. In some examples, the concatenated structure may result in a hierarchical code structure comprising 4 blocks (i.e., each block includes 4 KB of user data). The blocks can be decoded independently (i.e., using local parities). In case an error is detected in decoding the block, global parities are extracted which assist the decoder of the block. In some cases, the global parities are transferred as side-information to reduce detected errors in the decoding process.

Embodiments of the present disclosure include an efficient multistage encoding and an efficient multistage decoding structure. In some examples, the encoding and decoding may be performed for the individual 4 KB blocks, or for the complete 4×4 KB codeword.

Accurate decoding of the outer code of an individual block is ensured to proceed from one stage to the next. In some examples, the outer code is based on an RS code. For example, a soft-RS list decoder may be used to completely use the outer code. The decoder efficiently considers multiple hypotheses of RS vectors. One or more embodiments of the disclosure include a block decoder that uses the soft-RS list decoder to schedule stages of the multistage decoding of the block. In some cases, the list decoder may scan multiple hypotheses in parallel. Alternatively, the decoder may test one hypothesis at a time and recalls the scheduler to test another hypothesis in case of failure.

One or more embodiments of the disclosure include a soft-RS decoder that provides for testing hypotheses that contain erased RS symbols. The multi-stage coding scheme results in competitive throughput, and low error rate and latency using efficient encoding and decoding algorithms.

Figure 8:
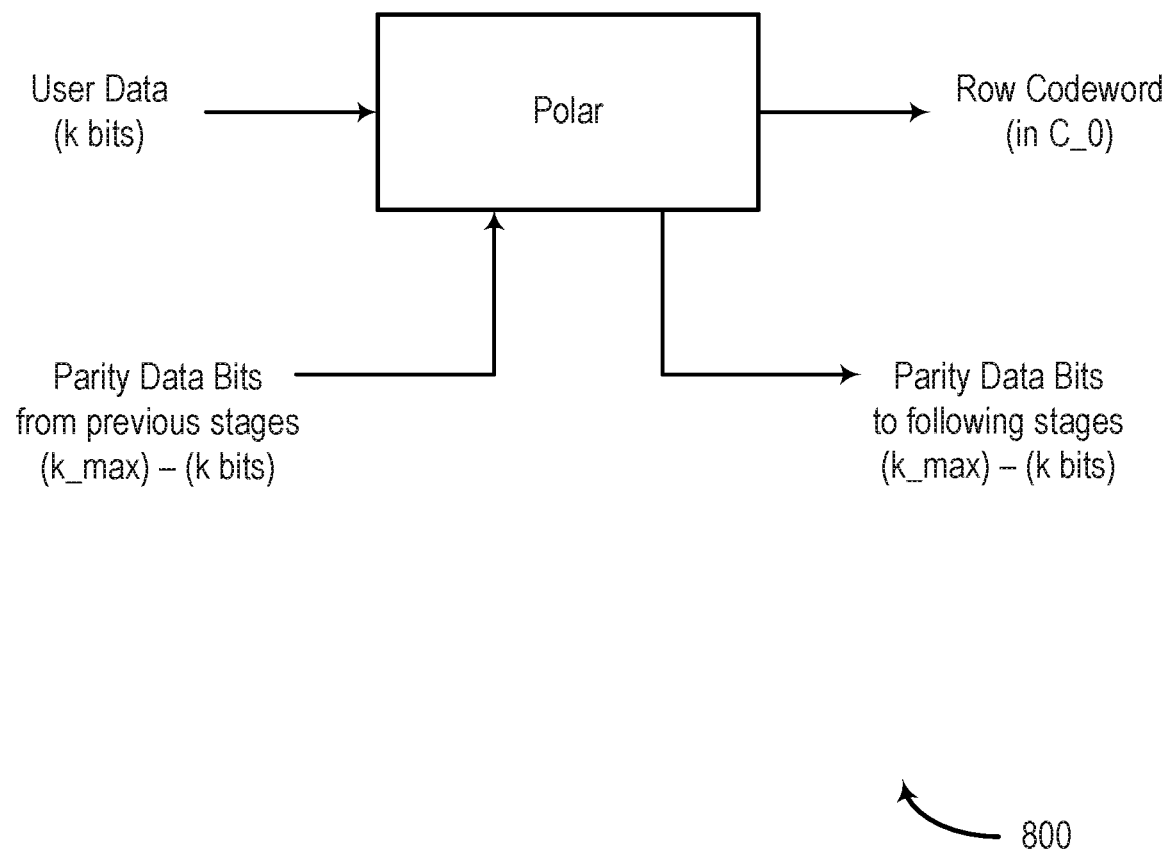
FIG. 8 shows an example of an inner coding scheme according to aspects of the present disclosure.

Inner-Most Code Encoding:

FIG. 8 shows an example of an inner coding scheme 800 according to aspects of the present disclosure. Inner coding scheme 800 (e.g., a polar coding scheme) may encode user data (e.g., k bits of user data) and parity data bits from previous stages (e.g., k_max–k bits) into a row codeword (e.g., as described in more detail herein, for example, with reference to row encoding 1005 described with reference to FIGS. 10 and 11). Further, the inner coding scheme 800 may generate parity data bits for following encoding stages. For instance, the inner-most code is given by a sequence of nested linear codes, i.e., $C_0 \supset C_1 \supset C_2 \supset \ldots C_L$. The nested linear codes can be described by partitioning the rows of the generated matrix to L parts according to dimension of the codes.

Figure 9:
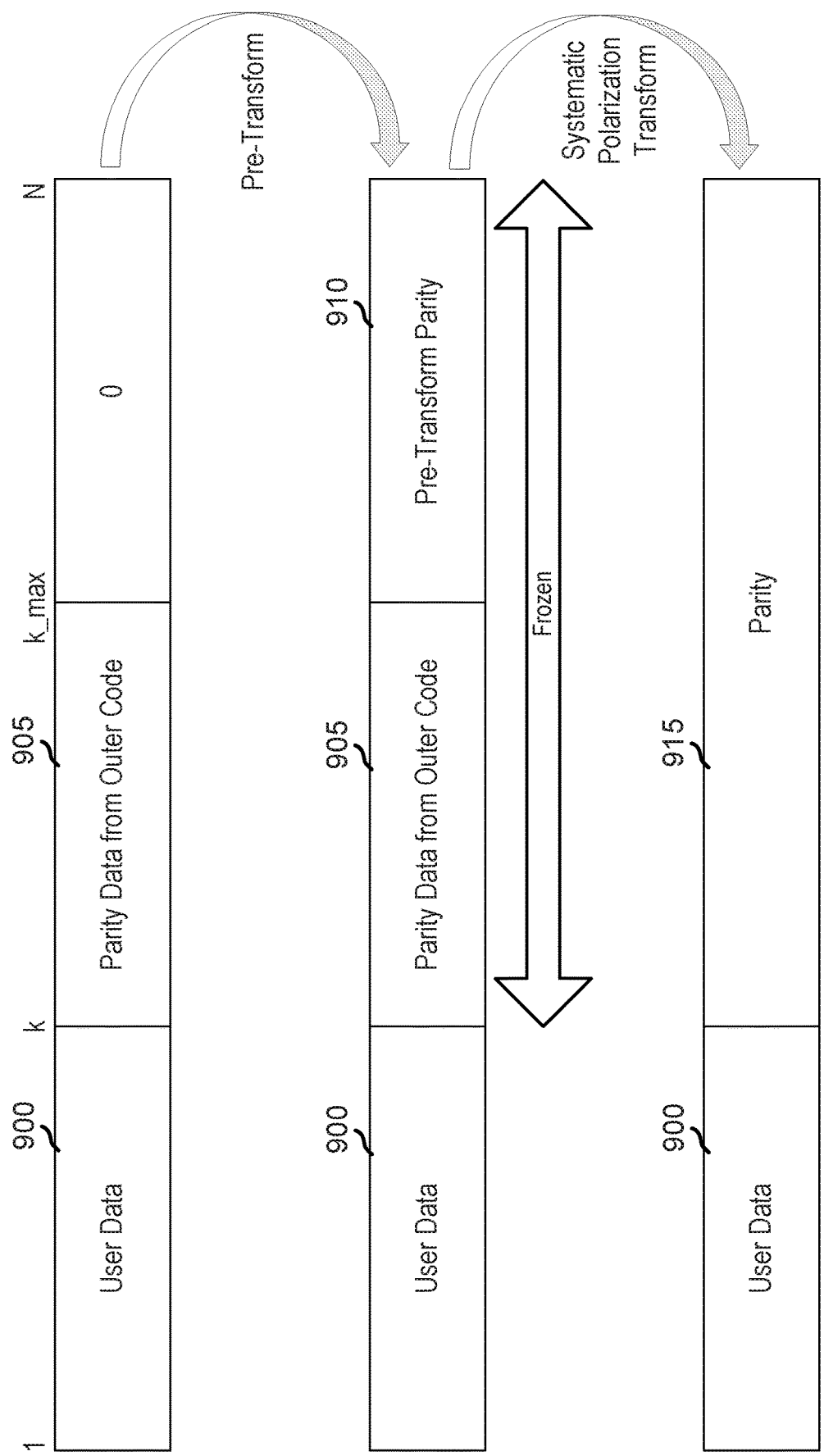
FIG. 9 shows an example of an inner encoding process according to aspects of the present disclosure.

FIG. 9 shows an example of an inner encoding process according to aspects of the present disclosure. The example shown includes user data 900, outer-most code parity bits 905, pre-transform parity bits 910, and post-transform parity bits 915. FIG. 9 illustrates aspects of a row encoding process where the vector elements are ordered according to the rate profile permutation.

In some cases, the codes are based on a polarization transform. For example, a method for constructing capacity achieving codes for symmetric binary input memoryless channels such as Arikan—Channel polarization may be used. The nested linear code is composed of three components, i.e., rate profiling, systematic pre-transformation, and polar transformation. In some cases, the systematic pre-transformation may be referred to as dynamic freezing or dynamic frozen. Additionally, the polar transformation may include bit-reversal. For example, the pre-transformation can be based on various codes such as polar+CRC, polar+ dynamic frozen, and PAC.

Consider a code with blocklength N. The rate profile is a fixed order (i.e., a permutation) of the polarized virtual bit-channels $[i_1, \ldots, i_N]$ for the sequence of nested codes. For a given code dimension k, the user data bits 900 (e.g., $[d_1, \ldots, d_k]$) and the parity data from the outer code (e.g., outer code parity bits 905, $[b_{k+1}, \ldots, b_{k_{max}}]$) are mapped into the vector $v = [v_1, \ldots, v_N]$ as follows:

$$[v_{i_1}, \ldots, v_{i_k}, v_{i_{k+1}}, \ldots, v_{i_{k_{max}}}] =$$
$$[d_1, \ldots, d_k, b_{k+1}, \ldots, b_{k_{max}}] \text{ and } \forall i \notin \{i_1, \ldots, i_{k_{max}}\}: v_i = 0.$$

In some cases, a fixed systematic pre-transformation, e.g., a systematic rate 1 code is used. For example, $\forall i \in \{i_1, \ldots, i_{k_{max}}\}: u_i = v_i$, is dynamic-frozen while $\forall i \notin \{i_1, \ldots, i_{k_{max}}\} u_i$ is a linear function of $i_1, \ldots, i_\ell$, where $$\ell \triangleq \max_{a_j \le i} j.$$

A systematic polar transform is applied after the pre-transformation. The parity data from the outer code (e.g., outer code parity bits 905) and the parity bits from the pre-transform (e.g., pre-transform parity bits 910) are considered as frozen bits by the systematic polar transform. Accordingly, the systematic polar transform may result in user data 900 and post-transform parity bits 915.

Figure 10:
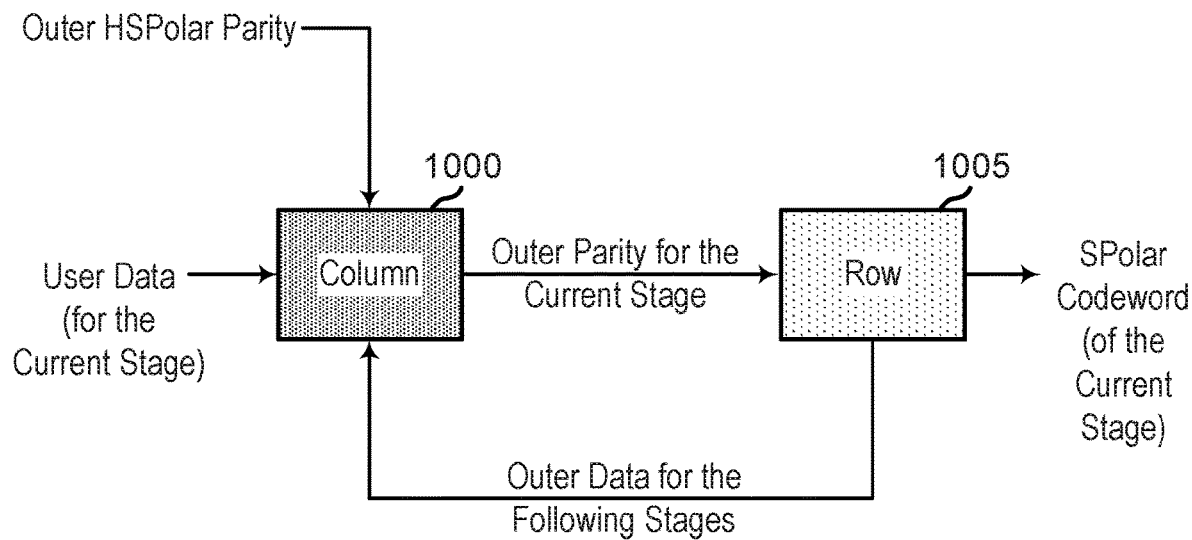
FIG. 10 shows an example of a middle encoding diagram according to aspects of the present disclosure.
Figure 10:

Middle Code Encoding:

FIG. 10 shows an example of a middle encoding diagram according to aspects of the present disclosure. The example shown includes column encoding 1000, row encoding 1005, and cells 1010. Cells 1010 are examples of, or include aspects of, the corresponding element described with reference to FIGS. 11 and 12. In some aspects, row encoding 1005 may refer to, or include aspects of, techniques described with reference to FIGS. 8 and 9.

SPolar encoding may be performed stage-by-stage. In each stage, the columns of that stage are first encoded (e.g., in the column domain via column encoding 1000). This codeword is then transformed into the row domain. Then, the rows of that stage are encoded using the information bits and the bits that came from the columns of that stage (e.g., via row encoding 1005). Accordingly, column encoding 1000 and row encoding 1005 can be conceptualized as generating user data bits and parity bits in cells 1010.

For example, in some cases, the middle (i.e., SPolar) code may be described or represented as a 2D rectangle. The rows of the code are polar codewords, and the rows are constrained by a second code. In some cases, user data bits and parity bits may be tabulated and represented by cells 1010 (e.g., where user data bits are blank or solid and parity bits from different code are represented with different levels of shading).

The nesting of the inner-most code implies a partition of the code $C_0$ to different stages. For example, the code may be partitioned to 0, 1, 2, or more stages where at a stage i, the polar code has the dimension of $C_i$. In some cases, the parity from the outer code is embedded by lifting the codeword to $C_0$.

For example, encoding is not performed in the column at stage 0 since the rate is 1. Row 1 is encoded, i.e., 1, 2, 3, 4→codeword [1, 2, 3, 4, 5]. Next, the parities or coset of the codeword in C1 is computed. In some cases, the computation is performed by transforming the row from the row domain to the column domain. The data thus obtained is used to encode the column of stage 1, i.e., [4, 9, 14, 19] is computed. Similarly, the information of 9 can be embedded in the row of stage 2 followed by computation of the codeword [6, 7, 8, 9, 10]. The encoding then proceeds to the next stages (e.g., an outer stage).

Figure 11:
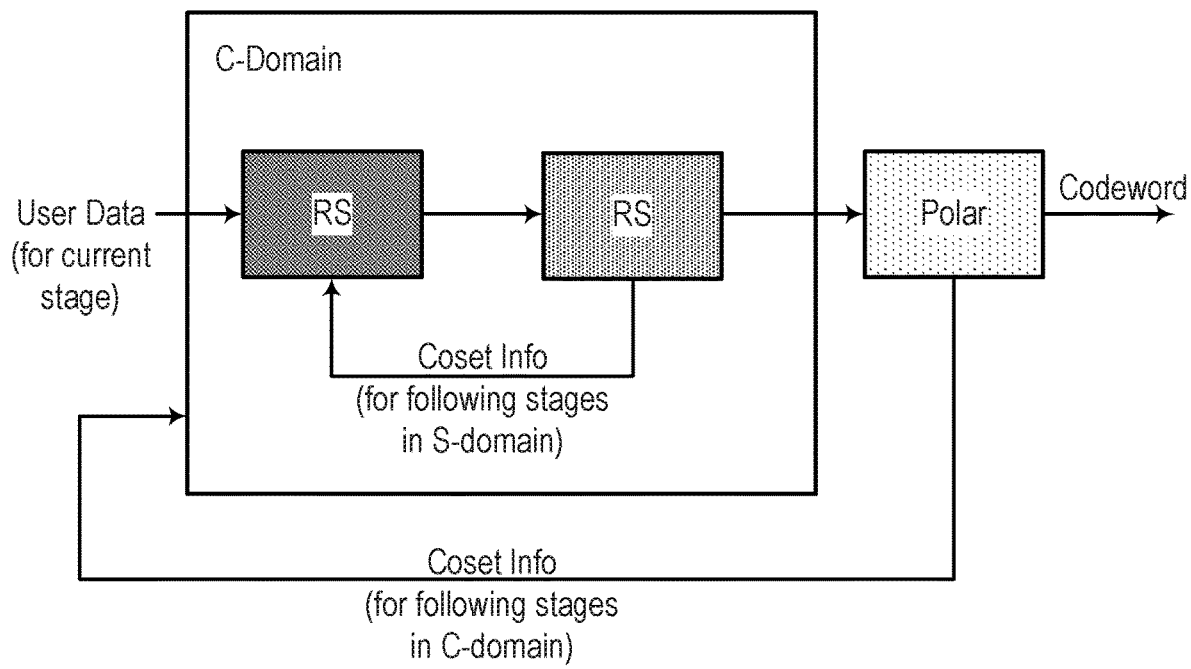
FIG. 11 shows an example of an outer encoding diagram according to aspects of the present disclosure.

Outer-Most Code Encoding:

FIG. 11 shows an example of an outer encoding diagram according to aspects of the present disclosure. Cells 1100 are examples of, or include aspects of, the corresponding element described with reference to FIGS. 10 and 12. FIG. 11 illustrates aspects of an inner coding scheme (e.g., a polar coding scheme), a middle coding scheme (e.g., an RS coding scheme), and an outer coding scheme (e.g., an RS coding scheme) to encode codewords from user data. In some aspects, generated codewords may include user data bits, inner-most code parity bits, middle code parity bits, and outer-most code parity bits (e.g., the encoding of which may be conceptualized via cells 1100 of FIG. 11).

An embodiment of the present disclosure includes an outer-most code (e.g., an outer-most HSPolar code). The code builds on a general structure which comprises a generalized concatenated error correction coding scheme with locality. FIG. 11 illustrates aspects of the outer-most (e.g., HSPolar code conceptualized as a 2D rectangle). For example, the row codes may be based on polarization (e.g., Arikan's polarization) and the columns may be based on S-RS codes in some transformed domain. In some cases, the S-RS code itself can be viewed as a 2D rectangle with rows that are RS codewords and columns (e.g., in the column domain) that are also RS codewords.

FIG. 11 illustrates aspects of an encoding process described herein. As described, user data bits and parity bits may be tabulated and represented by cells 1100 (e.g., where user data bits are blank or solid and parity bits from different code are represented with different levels of shading). For example, user data bits may be placed in (or represented as) blank or solid cells. Parity bits may be represented by light shaded cells (i.e., parities of the inner-most code or polar), medium shaded cells (i.e., middle code), and dark shaded cells (i.e., global parities of the outer-most code).

As a result, the nesting is represented as $S_i \supset S_{i+1} \supset S_{i+2} \supset S_{i+3}$, for i=0, 4, 8, 12 where S indicates the middle domain.

One or more embodiments of the present disclosure include an encoding algorithm that takes user data for the current stage as input and outputs a codeword. In some cases, the user data may be passed through global parities of the outermost code and the middle code followed by parities of the innermost code to provide the codeword. The algorithm includes a feedback mechanism due to the multistage process of the encoding. The coset information includes the parity bits of the outer code.

In some examples, outer-most code parity bits (e.g., dark shaded cells) are determined by the outer-most RS code. The dark shaded cells may be defined by blank or solid cells (i.e., information) in the same position in the previous block. Additionally, the middle code parity bits (e.g., the middle shaded cells) are set by the middle-RS code, and the inner-most code parity bits (e.g., light shaded cells) are set by the inner-most (polar) code.

Figure 12:
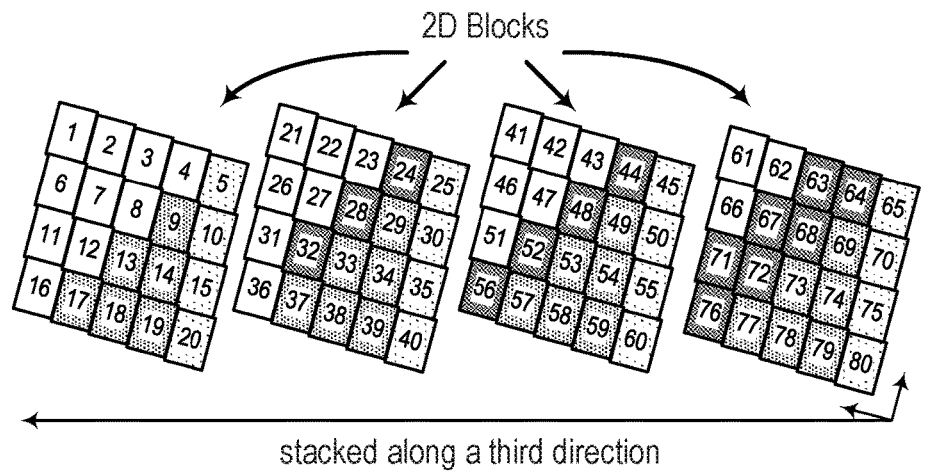
FIG. 12 shows an example of an outer-code encoding diagram according to aspects of the present disclosure.
Figure 12:
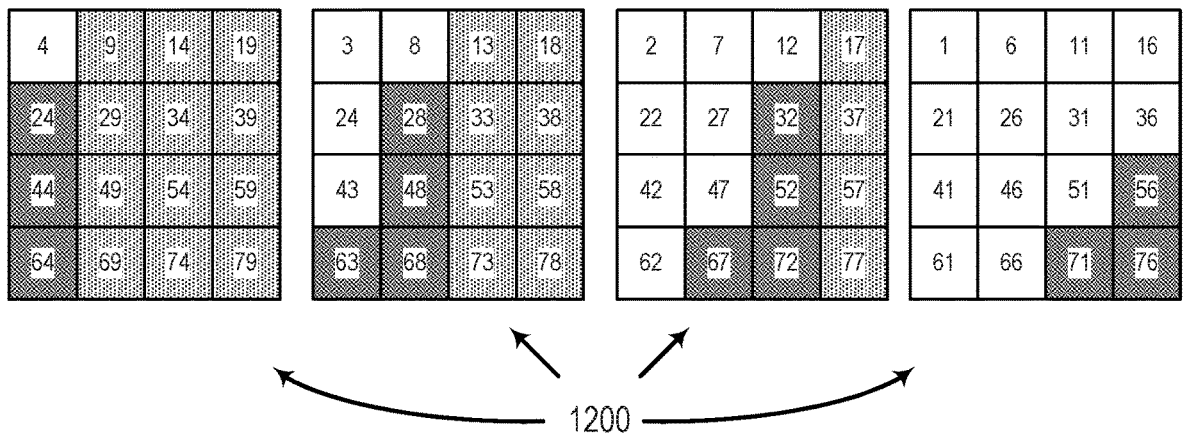

FIG. 12 shows an example of an outer-code encoding diagram according to aspects of the present disclosure. Cells 1200 are examples of, or include aspects of, the corresponding element described with reference to FIGS. 10 and 11. In some cases, as illustrated in FIG. 12, the code may be considered a 3D structure with stacked 2D blocks. For instance, the columns of the inner-most domain are transformed into a middle-column domain. In some examples, the transformed domains are represented as rectangles in the middle (S) domain.

The outer-most code parity bits (e.g., dark shaded cells) may be determined according to the outer-most RS code in the outer-most domain. Next, the middle code parity bits (e.g., middle shaded cells) are determined row-wise after the outer-most code parity bits (e.g., dark shaded cells) are determined column-wise. Further, the inner-most code parity bits (e.g., light shaded cells) are determined according to the inner-most code (i.e., polar). In some examples, the cells are determined according to the SPolar 2D block.

Example Decoder

Figure 13:
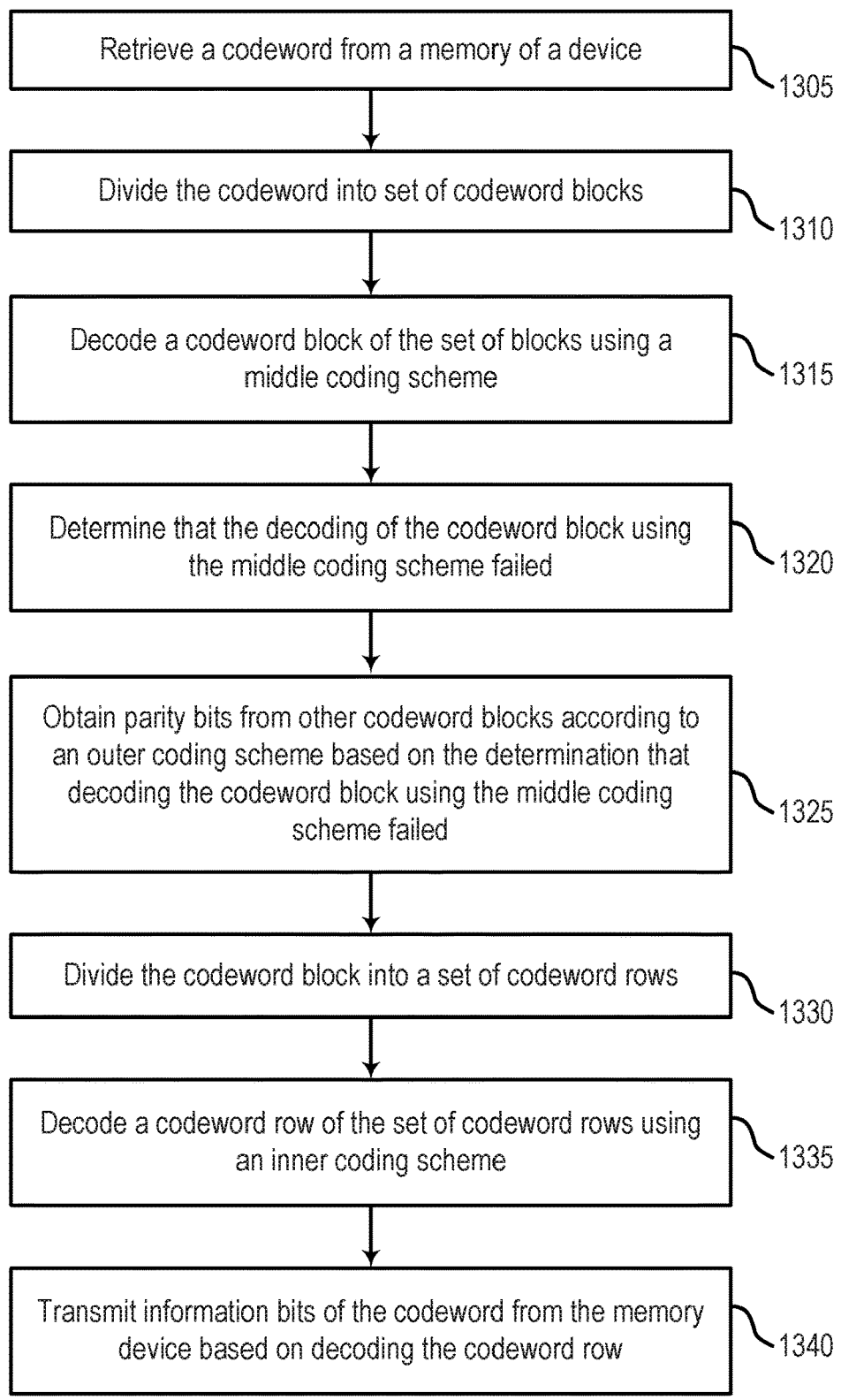
FIG. 13 shows an example of a process for ECC according to aspects of the present disclosure.

FIG. 13 shows an example of 1300 for error code correction according to aspects of the present disclosure. In some examples, these operations are performed by a system including a processor executing a set of codes to control functional elements of an apparatus. Additionally or alternatively, certain processes are performed using special-purpose hardware. Generally, these operations are performed according to the methods and processes described in accordance with aspects of the present disclosure. In some cases, the operations described herein are composed of various substeps, or are performed in conjunction with other operations.

A method for hierarchical ECC decoding using multistage concatenated codes is described. One or more aspects of the method include retrieving a codeword from a memory of a device; dividing the codeword into plurality of codeword blocks; decoding a codeword block of the plurality of blocks using a middle coding scheme; determining that the decoding of the codeword block using the middle coding scheme failed; obtaining parity bits from other codeword blocks according to an outer coding scheme based on the determination that decoding the codeword block using the middle coding scheme failed; dividing the codeword block into a plurality of codeword rows; decoding a codeword row of the plurality of codeword rows using an inner coding scheme; and transmitting information bits of the codeword from the memory device based on decoding the codeword row.

At operation 1305, the system retrieves a codeword from a memory of a device. In some cases, the operations of this step refer to, or may be performed by, memory controller as described with reference to FIG. 2.

At operation 1310, the system divides the codeword into set of codeword blocks. In some cases, the operations of this step refer to, or may be performed by, decoder as described with reference to FIG. 2.

At operation 1315, the system decodes a codeword block of the set of blocks using a middle coding scheme. In some cases, the operations of this step refer to, or may be performed by, decoder as described with reference to FIG. 2.

At operation 1320, the system determines that the decoding of the codeword block using the middle coding scheme failed. In some cases, the operations of this step refer to, or may be performed by, decoder as described with reference to FIG. 2.

At operation 1325, the system obtains parity bits from other codeword blocks according to an outer coding scheme based on the determination that decoding the codeword block using the middle coding scheme failed. In some cases, the operations of this step refer to, or may be performed by, decoder as described with reference to FIG. 2.

At operation 1330, the system divides the codeword block into a set of codeword rows. In some cases, the operations of this step refer to, or may be performed by, decoder as described with reference to FIG. 2.

At operation 1335, the system decodes a codeword row of the set of codeword rows using an inner coding scheme. In some cases, the operations of this step refer to, or may be performed by, decoder as described with reference to FIG. 2.

At operation 1340, the system transmits information bits of the codeword from the memory device based on decoding the codeword row. In some cases, the operations of this step refer to, or may be performed by, memory controller as described with reference to FIG. 2.

Further, an apparatus, a non-transitory computer readable medium, and a system for hierarchical ECC decoding using multistage concatenated codes is described. One or more aspects of the apparatus, non-transitory computer readable medium, and system include retrieving a codeword from a memory of a device; dividing the codeword into plurality of codeword blocks; decoding a codeword block of the plurality of blocks using a middle coding scheme; determining that the decoding of the codeword block using the middle coding scheme failed; obtaining parity bits from other codeword blocks according to an outer coding scheme based on the determination that decoding the codeword block using the middle coding scheme failed; dividing the codeword block into a plurality of codeword rows; decoding a codeword row of the plurality of codeword rows using an inner coding scheme; and transmitting information bits of the codeword from the memory device based on decoding the codeword row.

Some examples of the method, apparatus, non-transitory computer readable medium, and system further include performing soft decoding of the codeword using the outer coding scheme based on the determination that decoding the codeword using the outer coding scheme failed.

Some examples of the method, apparatus, non-transitory computer readable medium, and system further include decoding the codeword row using a low complexity decoder of the inner coding scheme. Some examples further include determining that decoding the codeword row using the low complexity decoder failed. Some examples further include decoding the codeword row using a high complexity decoder. In some aspects, the low complexity decoder comprises a successive cancellation decoder or a belief propagation decoder. In some aspects, the high complexity algorithm comprises a stepped list decoder or a sequential decoder.

In some aspects, the outer coding scheme comprises a RS coding scheme. In some aspects, the middle coding scheme comprises a RS coding scheme. In some aspects, the inner coding scheme comprises a polar coding scheme.

Figure 14:
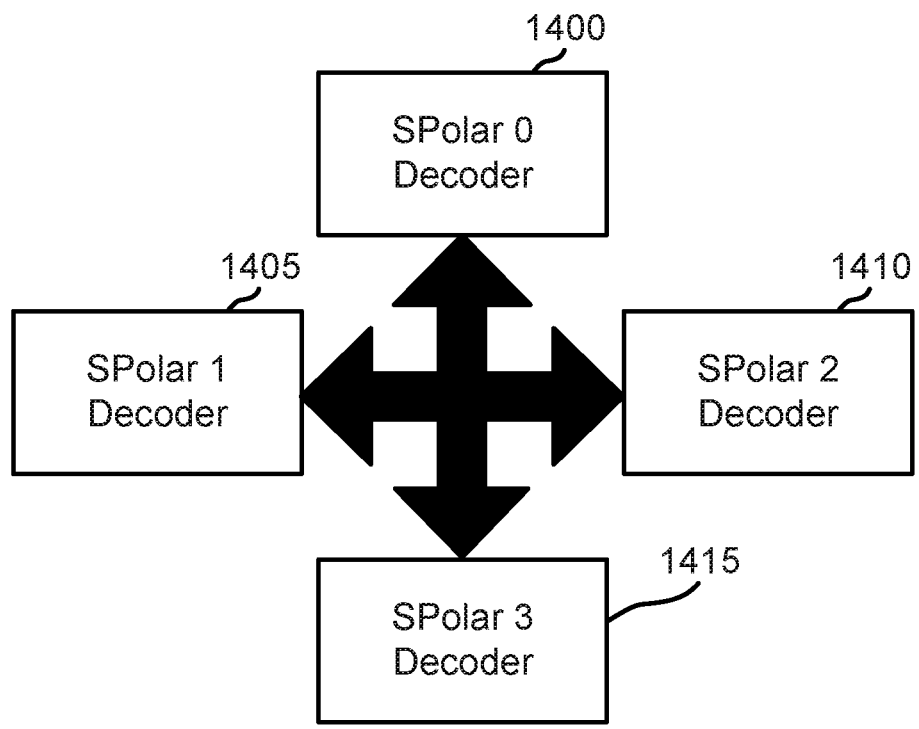
FIG. 14 shows an example of an outer decoding diagram according to aspects of the present disclosure.

Outer-Most Code Decoding:

FIG. 14 shows an example of an outer decoding diagram according to aspects of the present disclosure. The example shown includes first decoder 1400, second decoder 1405, third decoder 1410, and fourth decoder 1415. As described herein, a decoder may be configured to decode the information using a hierarchical coding scheme including an outer coding scheme, a middle coding scheme, and an inner coding scheme, wherein parity bits from the outer coding scheme are used when an error is detected in decoding a codeword block using the middle coding scheme, and wherein the inner coding scheme is used to decode codeword rows of the codeword block. In some aspects, the decoder is configured to perform a soft RS algorithm for the outer coding scheme.

One or more embodiments of the disclosure include a decoder with a concatenated error correction coding scheme. For instance, each block (e.g., each 4 KB SPolar block) can be decoded independently of other SPolar blocks in the HSPolar code. The SPolar requests global parities from the other SPolar blocks in case of a detected error. In some cases, the SPolar extracts global parities from the HSPolar structure. In some examples, the structure (e.g., a 4×4 KB structure) may not be completely decoded due to the multistage nature of the decoding process. The decoded SPolar block uses global parities for decoding. The other SPolar blocks (e.g., the assisting blocks) may request global parities from the decoded SPolar itself that is already extracted (e.g., in some cases, the decoded SPolar block are extracted by the other SPolar blocks). In some examples, the other SPolar blocks may be seen as passing messages in the depth axis between the different SPolar codes in a 3D structure view of the HSPolar code. For instance, SPolar #0 may be decoded. In case of detecting an error in the decoding process, the other SPolar decoders interact with each other to supply global parities (e.g., aspects of which are illustrated in FIG. 14).

Figure 15:
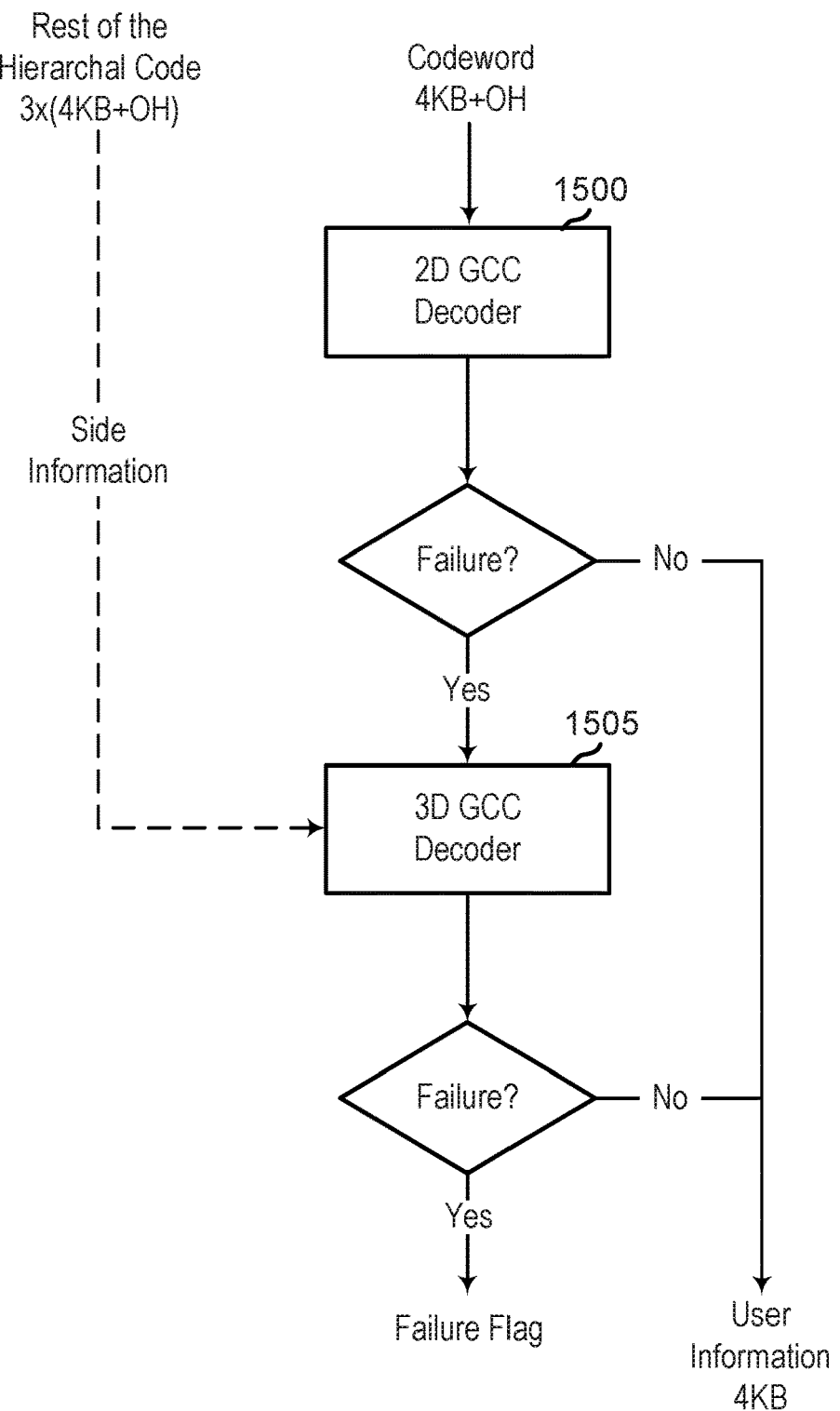
FIG. 15 shows an example of an outer decoding process according to aspects of the present disclosure.

FIG. 15 shows an example of an outer decoding process according to aspects of the present disclosure. The example shown includes 2D decoder 1500 and 3D decoder 1505 (e.g., which may be examples of decoders described with reference to FIG. 14). In some cases, a codeword (e.g., 4 KB user data with overhead (OH)) is provided to a 2D generalized concatenated code to decode the codeword via 2D decoder 1500). In case of error, the codeword is transferred to a 3D generalized concatenated code (e.g., 3D decoder 1505) which uses additional information from the rest of the hierarchical code (e.g., 3D decoder 1505 may utilize side information from the rest of the hierarchical code 3×(4 KB+OH)). A failure at the 3D concatenated code is presented as failure flag. Alternatively, user information (e.g., 4 KB of user information) is successfully decoded.

Middle Code Decoding:

In some aspects, the decoder is configured to perform a RS algorithm configured for the middle coding scheme, wherein the RS algorithm of the middle coding scheme is configured for use together with the inner coding scheme (e.g., wherein the decoder is configured to use a polar coding scheme for the inner coding scheme).

One or more embodiments of the present disclosure include decoding of an SPolar code (e.g., by progressing from a first stage to a last stage. The decoder progresses in stages, where without loss of generality, the first block is considered. The decoding process starts at stage 0 (e.g., decodes rows under C0). Next, the S-RS code (e.g., S-domain) is used to decode an entire column (e.g., the column of C1). Once a column is successfully decoded, the decoding process continues similarly for other stages. The HSPolar structure is used in case of decoding failure by the S-RS code. If all the stages are successfully decoded, the decoder declares success.

Soft-RS:

When there is a failure in the RS of a certain stage, it is possible to perform soft-RS decoding (rather than standard RS decoding within the minimum distance). For example, in cases where certain RS symbols hypothesis have weak reliability, a single alternative RS symbol hypothesis may be used for the decoding of the RS.

In some examples, a Fast Chase algorithm is an algorithm that scans the options efficiently, and this efficiency is achieved by the following properties of the scan. One property of the scan is such that, when going from one vector-hypothesis to another, previous computations (more specifically the output of the Berlekamp-Massey) are used, and only the required difference for the new vector-hypotheses are modified. Another property of the scan is that it does not require doing a search such as a Chien search (e.g., for finding the roots of the ELP) for every candidate that is scanned. In a single RS decoding the search may be implemented in order to check if the decoding succeeds (in addition to finding the error locations). But in the Fast Chase scan, even if the RS decoding of a vector-hypotheses succeeds, the scan may be continued without the search. A probabilistic indication tells whether to perform the search. It may have a false alarm, but no mis-correct.

It is therefore desired to scan (e.g., via a tree scan) the vector-hypotheses where there is a single RS-symbol that change. Using such a scan (e.g., a tree scan), in every step the choice of whether to erase the RS symbol instead of replacing it by its alternative hypothesis symbol may be made. In case the scan successfully decoded multiple codewords, the most likely codeword may be selected. In some aspects, a Koetter's iteration for adjoining error location algorithm may be implemented.

Figure 16:
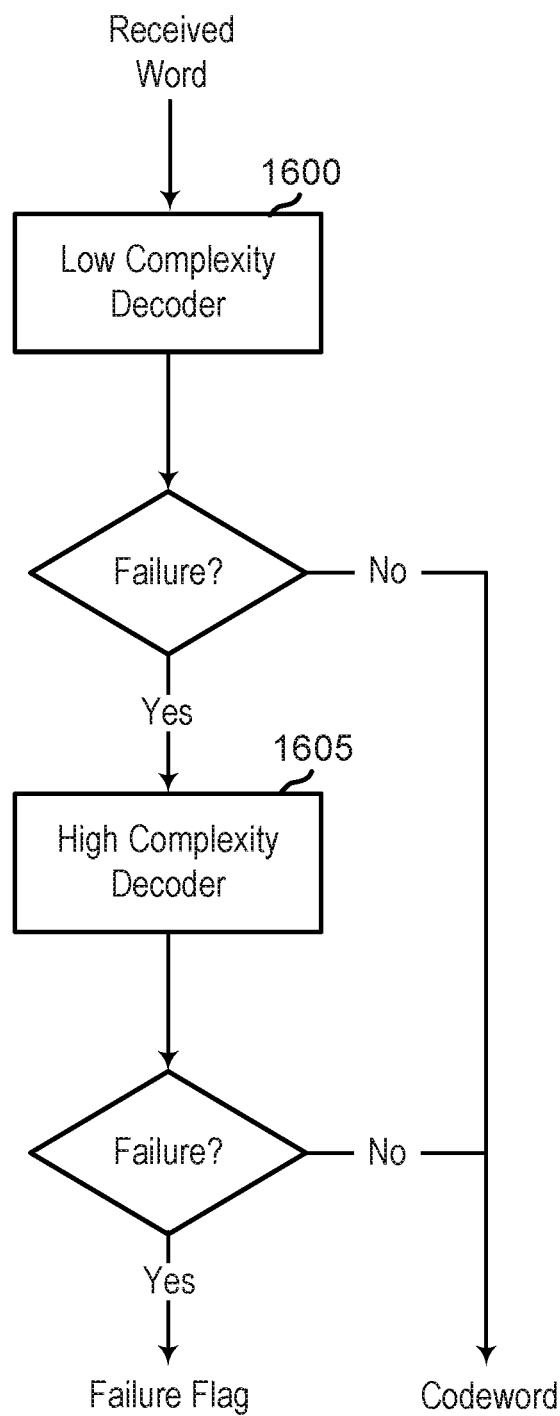
FIG. 16 shows an example of an inner decoding process according to aspects of the present disclosure.

Inner-Most Code Decoding:

FIG. 16 shows an example of an inner decoding process according to aspects of the present disclosure. The example shown includes low complexity decoder 1600 and high complexity decoder 1605. In some aspects, a decoder described herein comprises a low complexity polar decoder 1600 and a high complexity polar decoder 1605 (e.g., for the inner coding scheme). For example, in cases where a received codeword is not successfully decided by a low complexity decoder 1600 (e.g., in case of a decoding failure by low complexity decoder 1600), the received codeword may be decoded by high complexity decoder 1605. If either of the low complexity decoder 1600 and high complexity decoder 1605 are able to successfully decode the received codeword, the codeword (e.g., user data) may be successfully decoded. Otherwise, a failure flag may result.

FIG. 16 may illustrate aspects of combining low latency decoders and high latency decoders. For instance, in order to achieve both good a throughput and latency and a good FER, low latency decoders (e.g., having rather high FER) may be combined with high latency decoders (e.g., having the target FER). In some cases, high complexity decoders may include stepped list decoder, sequential decoder, etc. Further, low complexity decoders may include simplified successive cancellation, belief propagation, etc.

The description and drawings described herein represent example configurations and do not represent all the implementations within the scope of the claims. For example, the operations and steps may be rearranged, combined or otherwise modified. Also, structures and devices may be represented in the form of block diagrams to represent the relationship between components and avoid obscuring the described concepts. Similar components or features may have the same name but may have different reference numbers corresponding to different figures.

Some modifications to the disclosure may be readily apparent to those skilled in the art, and the principles defined herein may be applied to other variations without departing from the scope of the disclosure. Thus, the disclosure is not limited to the examples and designs described herein, but is to be accorded the broadest scope consistent with the principles and novel features disclosed herein.

The described systems and methods may be implemented or performed by devices that include a general-purpose processor, a digital signal processor (DSP), an application specific integrated circuit (ASIC), a field programmable gate array (FPGA) or other programmable logic device, discrete gate or transistor logic, discrete hardware components, or any combination thereof. A general-purpose processor may be a microprocessor, a conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration). Thus, the functions described herein may be implemented in hardware or software and may be executed by a processor, firmware, or any combination thereof. If implemented in software executed by a processor, the functions may be stored in the form of instructions or code on a computer-readable medium.

Computer-readable media includes both non-transitory computer storage media and communication media including any medium that facilitates transfer of code or data. A non-transitory storage medium may be any available medium that can be accessed by a computer. For example, non-transitory computer-readable media can comprise random access memory (RAM), read-only memory (ROM), electrically erasable programmable read-only memory (EEPROM), compact disk (CD) or other optical disk storage, magnetic disk storage, or any other non-transitory medium for carrying or storing data or code.

Also, connecting components may be properly termed computer-readable media. For example, if code or data is transmitted from a website, server, or other remote source using a coaxial cable, fiber optic cable, twisted pair, digital subscriber line (DSL), or wireless technology such as infrared, radio, or microwave signals, then the coaxial cable, fiber optic cable, twisted pair, DSL, or wireless technology are included in the definition of medium. Combinations of media are also included within the scope of computer-readable media.

In this disclosure and the following claims, the word "or" indicates an inclusive list such that, for example, the list of X, Y, or Z means X or Y or Z or XY or XZ or YZ or XYZ. Also the phrase "based on" is not used to represent a closed set of conditions. For example, a step that is described as "based on condition A" may be based on both condition A and condition B. In other words, the phrase "based on" shall be construed to mean "based at least in part on." Also, the words "a" or "an" indicate "at least one."

What is claimed is:

1. A method comprising:
receiving information bits for storage in a memory device;
generating first parity bits based on the information bits using an outer coding scheme;
generating second parity bits based on the information bits and the first parity bits using a middle coding scheme;
generating third parity bits based on the information bits, the first parity bits, and the second parity bits using an inner coding scheme;
combining the information bits, the first parity bits, the second parity bits, and the third parity bits as a codeword; and
storing the codeword in the memory device.

2. The method of claim 1, further comprising:
assigning position information to the information bits, wherein the position information includes a row index and a column index, wherein the first parity bits are generated column-wise based on the position information, and wherein the second parity bits are generated row-wise based on the position information.

3. The method of claim 1, further comprising:
alternately encoding columns and rows of a block of the information bits using the middle coding scheme.

4. The method of claim 1, further comprising:
encoding a row including a portion of the information bits, a portion of the first parity bits, a portion of the second parity bits, and a first portion of the third parity bits from a previous row using the inner coding scheme to obtain an encoded row and a second portion of the third parity bits for a next row.

5. The method of claim 1, wherein:
the outer coding scheme comprises a Reed-Solomon coding scheme.

6. The method of claim 1, wherein:
the middle coding scheme comprises a Reed-Solomon coding scheme.

7. The method of claim 1, wherein:
the inner coding scheme comprises a polar coding scheme.

8. A method comprising:
retrieving a codeword from a memory of a device;
dividing the codeword into plurality of codeword blocks;
decoding a codeword block of the plurality of codeword blocks using a middle coding scheme;
determining that the decoding of the codeword block using the middle coding scheme failed;

obtaining parity bits from other codeword blocks according to an outer coding scheme based on the determination that decoding the codeword block using the middle coding scheme failed;

dividing the codeword block into a plurality of codeword rows;

decoding a codeword row of the plurality of codeword rows using an inner coding scheme; and transmitting information bits of the codeword from the memory of the device based on decoding the codeword row.

9. The method of claim 8, further comprising:

performing soft decoding of the codeword using the outer coding scheme based on the determination that decoding the codeword using the middle coding scheme failed.

10. The method of claim 8, further comprising:

decoding the codeword row using a low complexity decoder of the inner coding scheme;

determining that decoding the codeword row using the low complexity decoder failed; and decoding the codeword row using a high complexity decoder.

11. The method of claim 10, wherein:

the low complexity decoder comprises a successive cancellation decoder or a belief propagation decoder.

12. The method of claim 11, wherein:

a high complexity algorithm comprises a stepped list decoder or a sequential decoder.

13. The method of claim 8, wherein:

the outer coding scheme comprises a Reed-Solomon coding scheme.

14. The method of claim 8, wherein:

the middle coding scheme comprises a Reed-Solomon coding scheme.

15. The method of claim 8, wherein:

the inner coding scheme comprises a polar coding scheme.

16. An apparatus comprising:

a memory device;

an encoder configured to encode information for storage in the memory device using a hierarchical coding scheme including an outer coding scheme, a middle coding scheme, and an inner coding scheme; and a decoder configured to decode the information using the hierarchical coding scheme, wherein parity bits from the outer coding scheme are used when an error is detected in decoding a codeword block using the middle coding scheme, and wherein the inner coding scheme is used to decode codeword rows of the codeword block.

17. The apparatus of claim 16, wherein:

the decoder is configured to perform a soft Reed-Solomon algorithm for the outer coding scheme.

18. The apparatus of claim 16, wherein:

the decoder is configured to perform a Reed-Solomon algorithm configured for the middle coding scheme, wherein the Reed-Solomon algorithm of the middle coding scheme is configured for use together with the inner coding scheme.

19. The apparatus of claim 16, wherein:

the decoder is configured to use a polar coding scheme for the inner coding scheme.

20. The apparatus of claim 16, wherein: the decoder comprises a low complexity polar decoder and a high complexity polar decoder for the inner coding scheme.

* * * * *